United States Patent
Ebata et al.

(10) Patent No.: US 9,184,626 B2
(45) Date of Patent: Nov. 10, 2015

(54) PHOTOVOLTAIC SYSTEM AND POWER SUPPLY SYSTEM

(75) Inventors: Yoshio Ebata, Fuchu (JP); Hideki Hayashi, Kawasaki (JP); Yasuhiro Noro, Hino (JP); Misao Kimura, Fuchu (JP); Kazuya Omata, Uenohara (JP); Toshiaki Asano, Asaka (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 678 days.

(21) Appl. No.: 13/543,112

(22) Filed: Jul. 6, 2012

(65) Prior Publication Data

US 2012/0277930 A1    Nov. 1, 2012

Related U.S. Application Data

(63) Continuation of application No. PCT/JP2011/053068, filed on Feb. 15, 2011.

(30) Foreign Application Priority Data

Mar. 11, 2010    (JP) ................. 2010-054919

(51) Int. Cl.
  *H02J 7/35*    (2006.01)
  *H01L 31/02*    (2006.01)
  *H02J 3/32*    (2006.01)
  *H02J 3/38*    (2006.01)
  *H02S 50/10*    (2014.01)

(52) U.S. Cl.
  CPC ............. *H02J 7/35* (2013.01); *H01L 31/02021* (2013.01); *H02J 3/32* (2013.01); *H02J 3/383* (2013.01); *H02S 50/10* (2014.12); *Y02E 10/563* (2013.01); *Y02E 10/566* (2013.01); *Y02E 70/30* (2013.01)

(58) Field of Classification Search
  None
  See application file for complete search history.

(56) References Cited

U.S. PATENT DOCUMENTS

| | | | |
|---|---|---|---|
| 4,636,931 | A | 1/1987 | Takahashi et al. |
| 5,268,832 | A | 12/1993 | Kandatsu |
| 6,563,234 | B2 | 5/2003 | Hasegawa et al. |
| 7,116,010 | B2 | 10/2006 | Lasseter et al. |

(Continued)

FOREIGN PATENT DOCUMENTS

| | | |
|---|---|---|
| CN | 101479928 A | 7/2009 |
| CN | 101841160 A | 9/2010 |

(Continued)

OTHER PUBLICATIONS

U.S. Appl. No. 13/610,152, filed Sep. 11, 2012, Misao et al.

(Continued)

*Primary Examiner* — Sean Shechtman
*Assistant Examiner* — Steven Garland
(74) *Attorney, Agent, or Firm* — Foley & Lardner LLP

(57) ABSTRACT

According to one embodiment, the photovoltaic system includes a memory configured to store power generator characteristics to be applied to the photovoltaic system, a calculation section configured to calculate an output target value to be output by the photovoltaic system using the power generator characteristics read from the memory, an operation target value, system data of a power system, and output data from the photovoltaic system to the power system, and a photovoltaic section configured to supply a corresponding power to the power system based on the output target value calculated by the calculation section.

18 Claims, 24 Drawing Sheets

(56) References Cited

U.S. PATENT DOCUMENTS

| | | | |
|---|---|---|---|
| 7,932,637 | B2 | 4/2011 | Lasseter et al. |
| 2001/0012211 | A1 | 8/2001 | Hasegawa et al. |
| 2004/0051387 | A1 | 3/2004 | Lasseter et al. |
| 2009/0310390 | A1 | 12/2009 | Ohshima et al. |
| 2010/0256970 | A1 | 10/2010 | Heese et al. |
| 2010/0327657 | A1 | 12/2010 | Kuran |
| 2012/0173031 | A1* | 7/2012 | Parameswaran et al. ..... 700/295 |

FOREIGN PATENT DOCUMENTS

| | | |
|---|---|---|
| CN | 101902050 A | 12/2010 |
| DE | 102006047792 A1 | 4/2008 |
| EP | 1 801 950 A2 | 6/2007 |
| JP | 07 163054 A | 6/1995 |
| JP | 2001-211548 A | 8/2001 |
| JP | 2001-292531 A | 10/2001 |
| JP | 2002-017044 A | 1/2002 |
| JP | 2005-094921 A | 4/2005 |
| JP | 2005-102357 A | 4/2005 |
| JP | 2007-082361 A | 3/2007 |
| JP | 2006-146525 A | 6/2007 |
| JP | 2007-244068 A | 9/2007 |
| JP | 2007-274841 A | 10/2007 |
| JP | 4170565 B2 | 8/2008 |
| JP | 2009-225599 A | 10/2009 |
| JP | 2011-8348 A | 1/2011 |
| TW | M337931 | 8/2008 |
| WO | WO-2010/000664 A2 | 1/2010 |
| WO | WO-2010/014073 A1 | 2/2010 |

OTHER PUBLICATIONS

U.S. Appl. No. 13/939,668, filed Jul. 11, 2013, Kimura et al.

Non-Final Office Action issued in co-pending U.S. Appl. No. 13/610,152 mailed Mar. 6, 2015. (13 pages).

Driesen J et al: "Virtual synchronous generators", Power and Energy Society General Meeting-Conversion and Delivery of Electrical Energy in the 21ST Century, IEEE, Jul. 20, 2008, pp. 1-3.

Extended European Search Report issued in EP 11753137.6 dated Aug. 19, 2015.

Qing-Chang Zhong et al: "Static synchronous generators for distributed generation and renewable energy", Power Systems Conference and Exposition, IEEE/PES, Mar. 15, 2009, pp. 1-6.

US Notice of Allowance dated Jul. 30, 2015 issued in U.S. Appl. No. 13/610,152.

Van Thong V et al: "Virtual synchronous generator: Laboratory scale results and field demonstration", Powertech, Jun. 28, 2009, IEEE Bucharest, pp. 1-6.

* cited by examiner

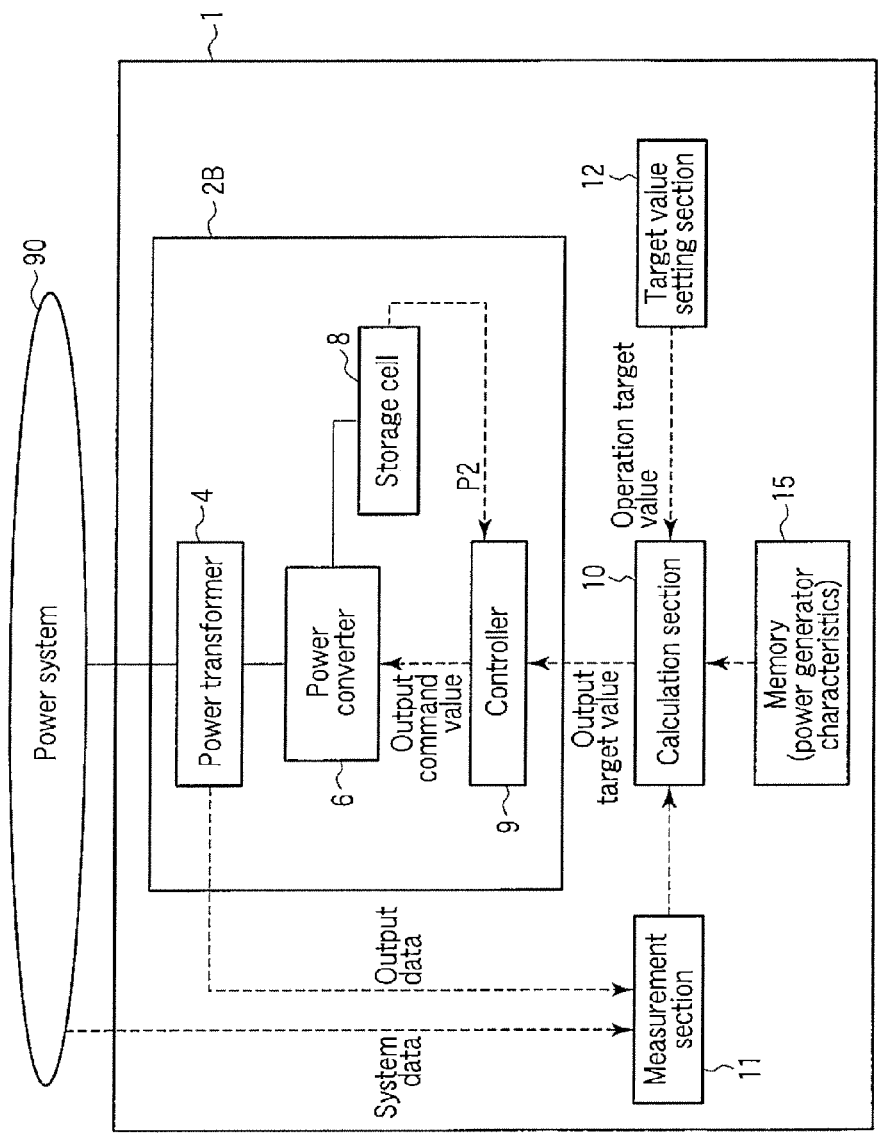
F I G. 1B

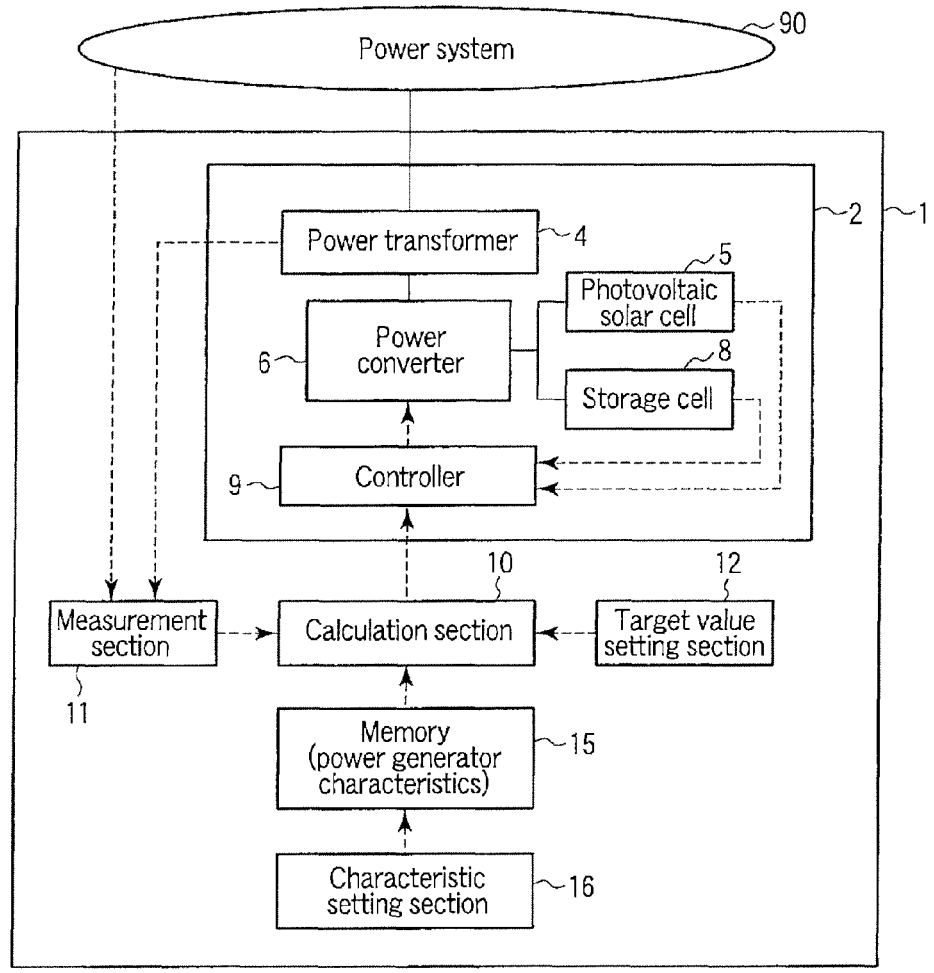
F I G. 2A

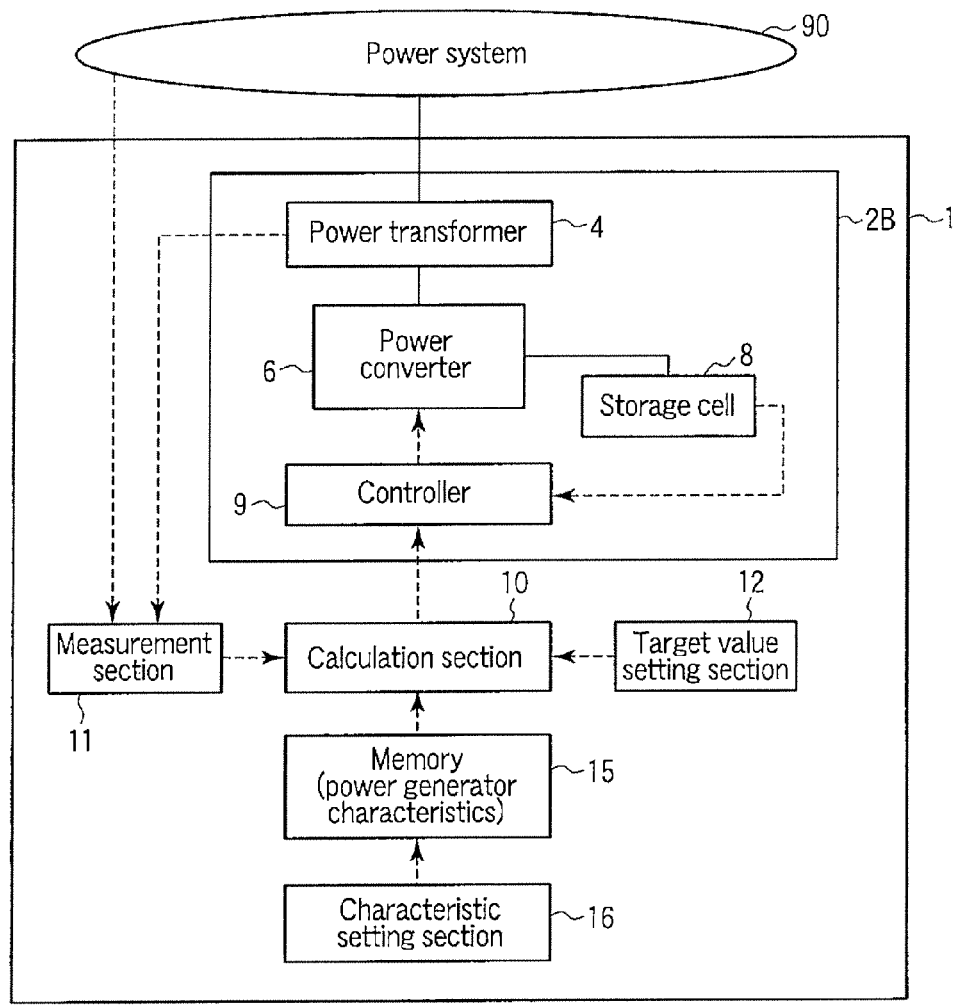
F I G. 2B

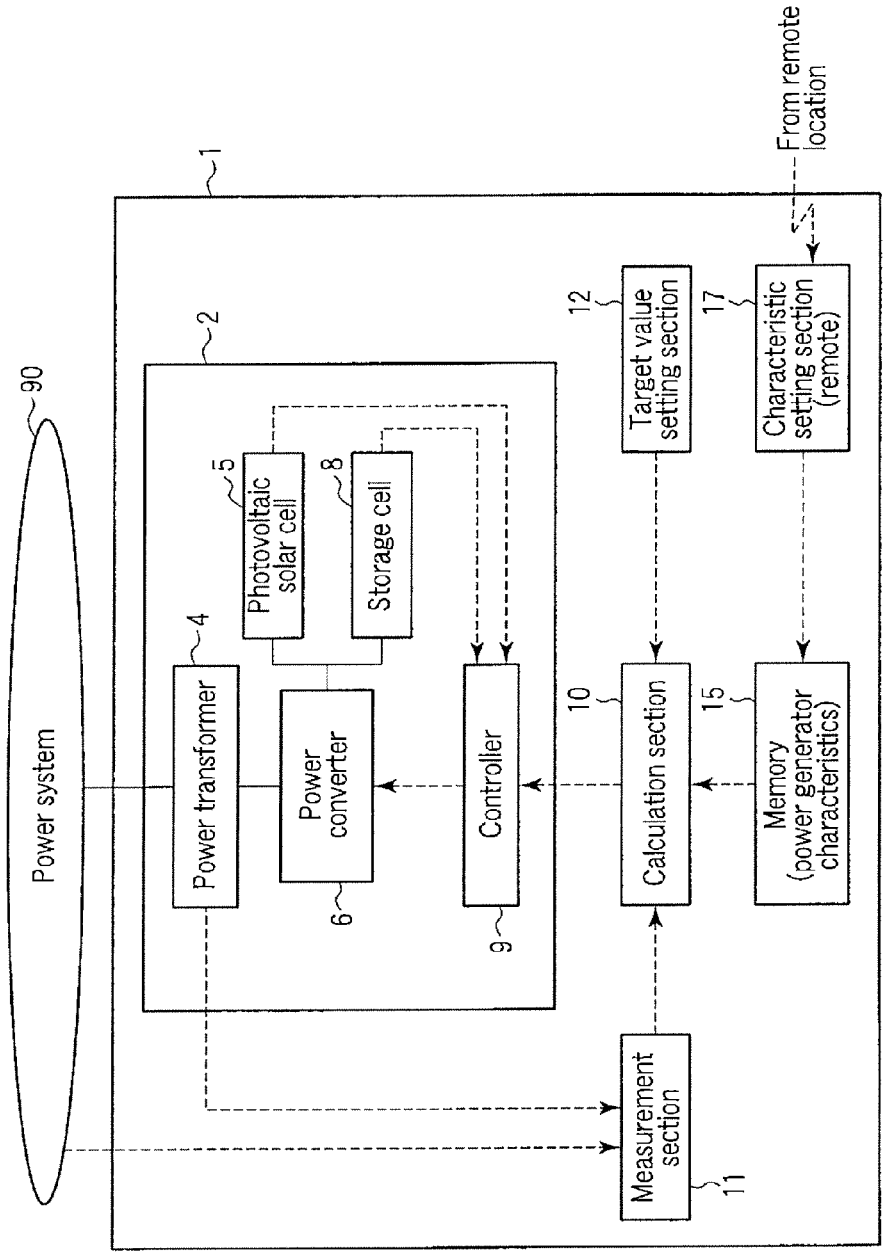
F I G. 3A

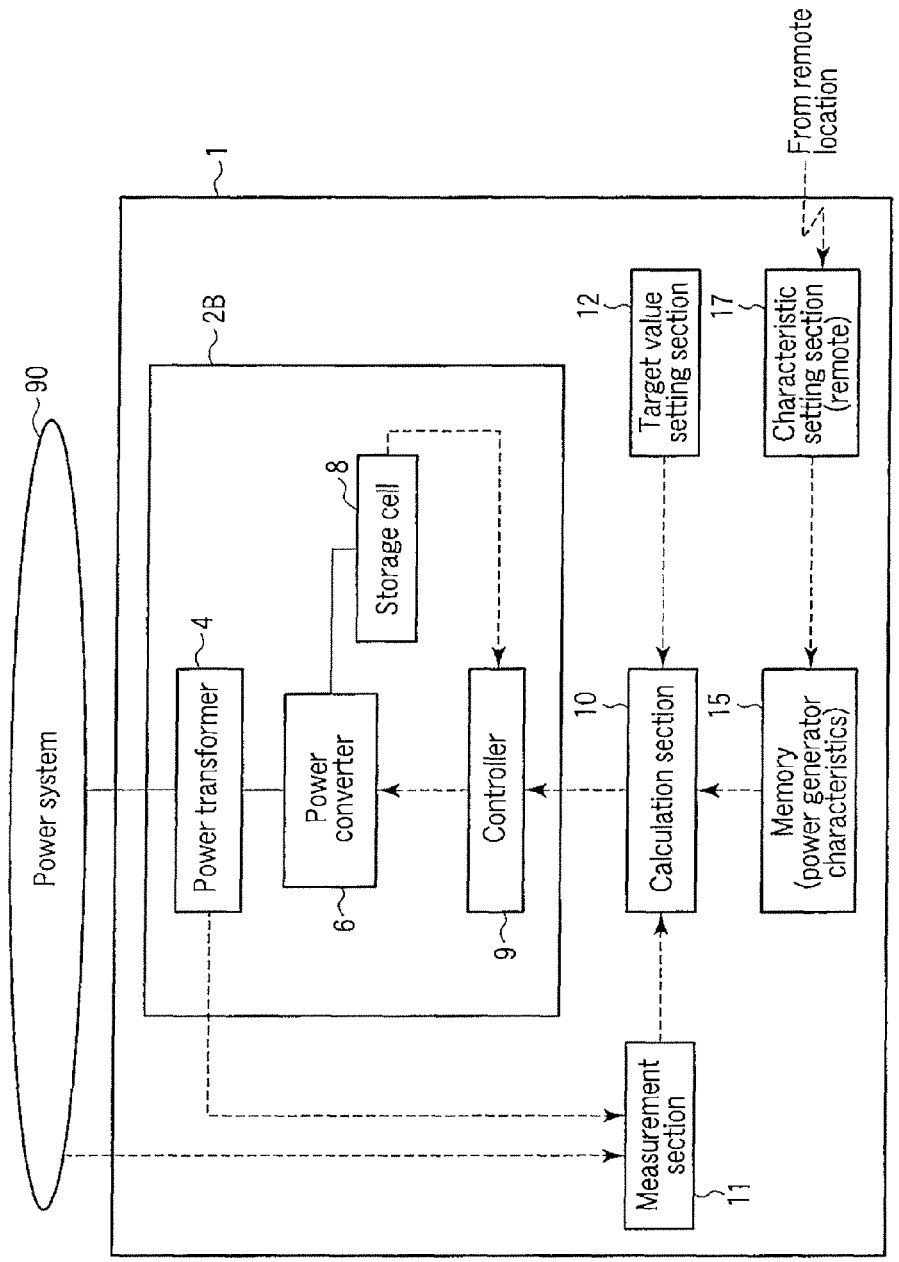
F I G. 3B

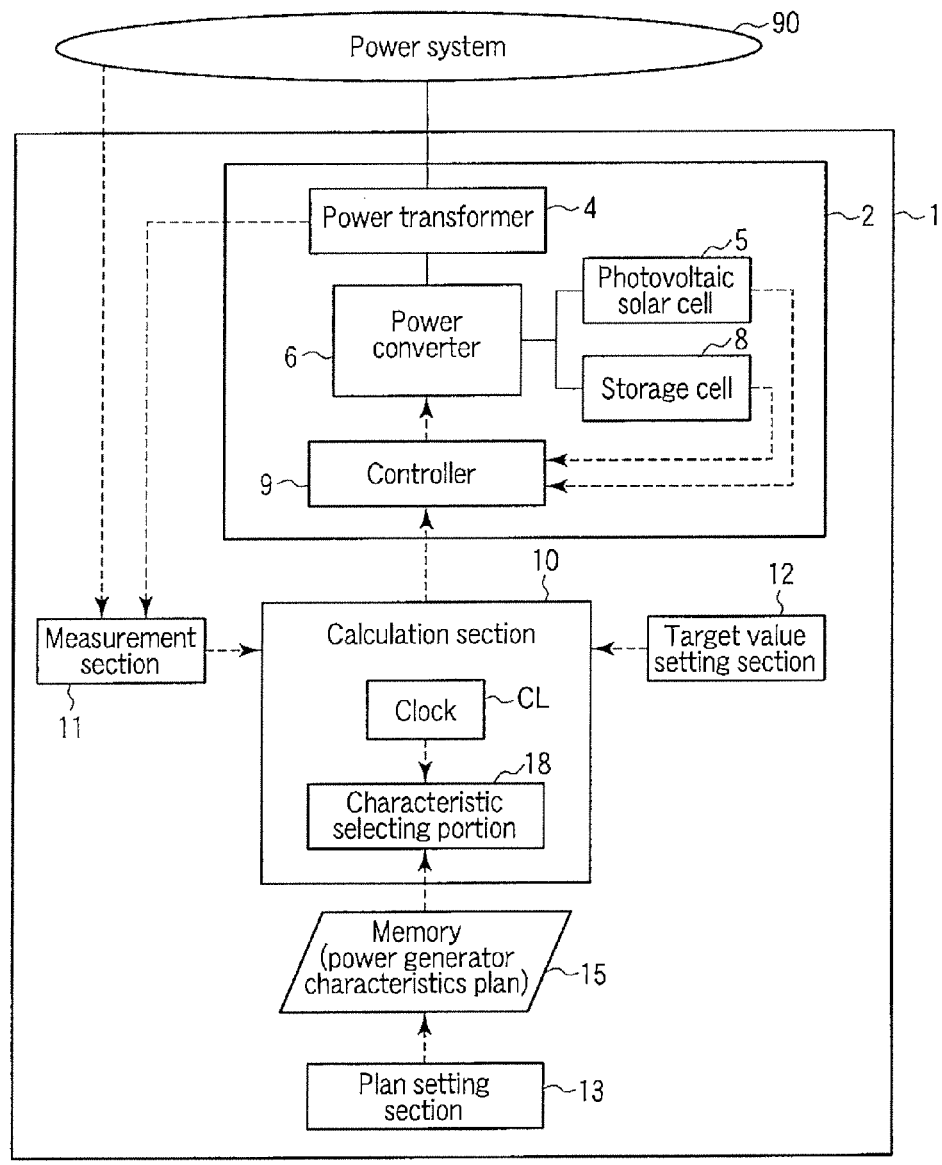
F I G. 4A

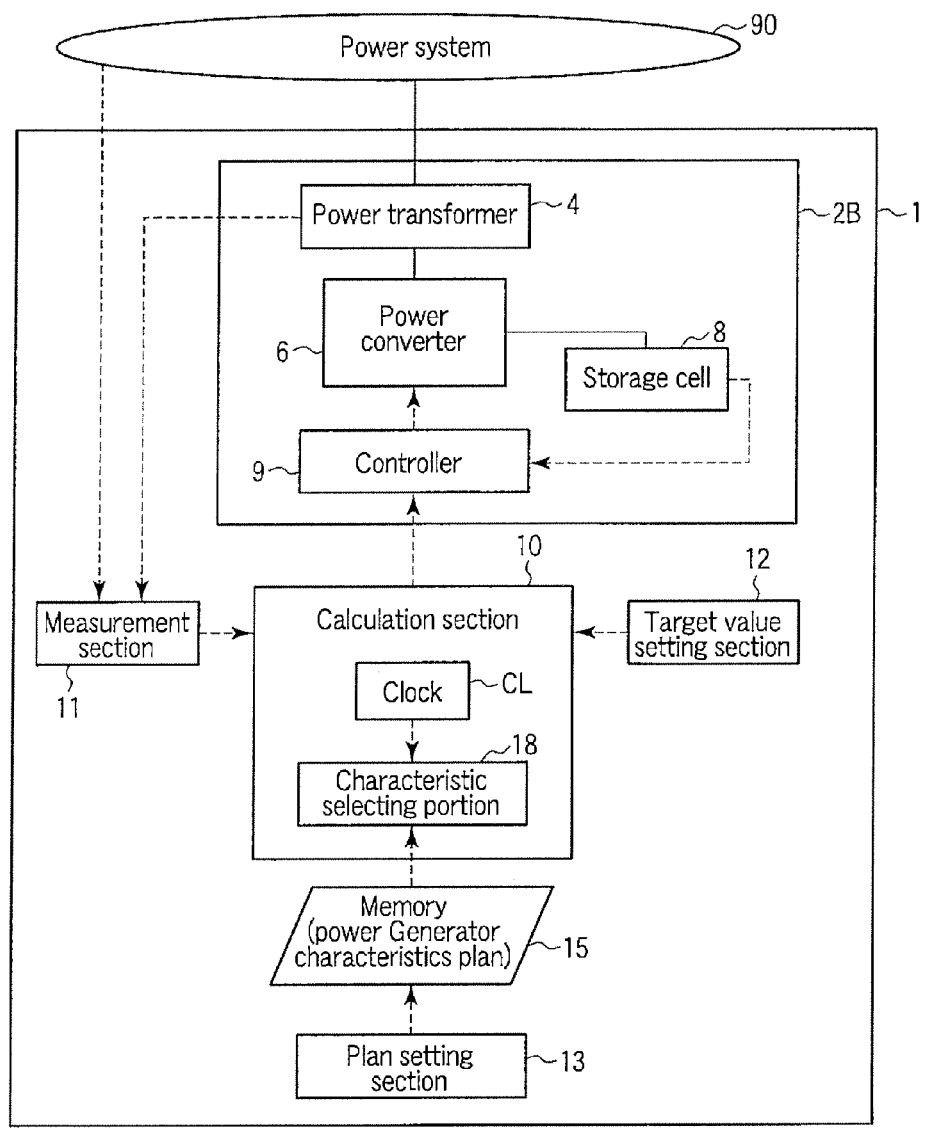
F I G. 4B

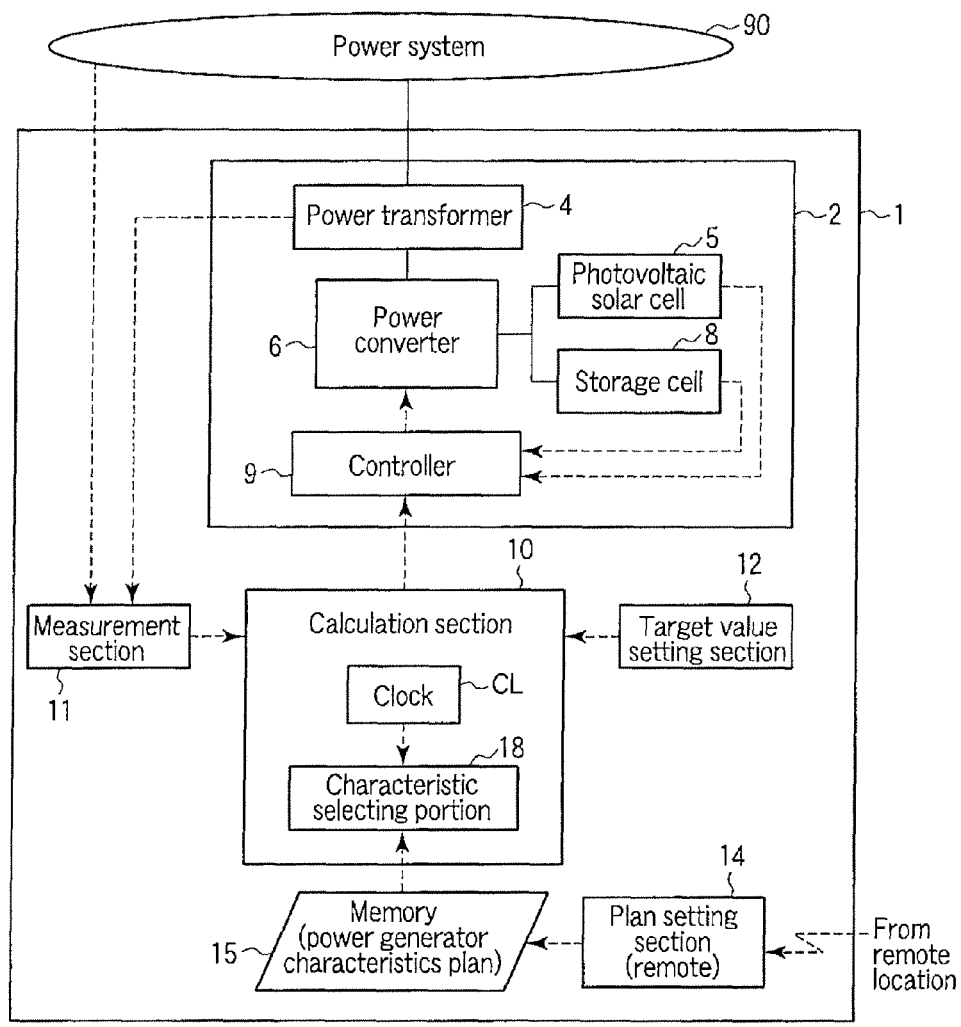
F I G. 5A

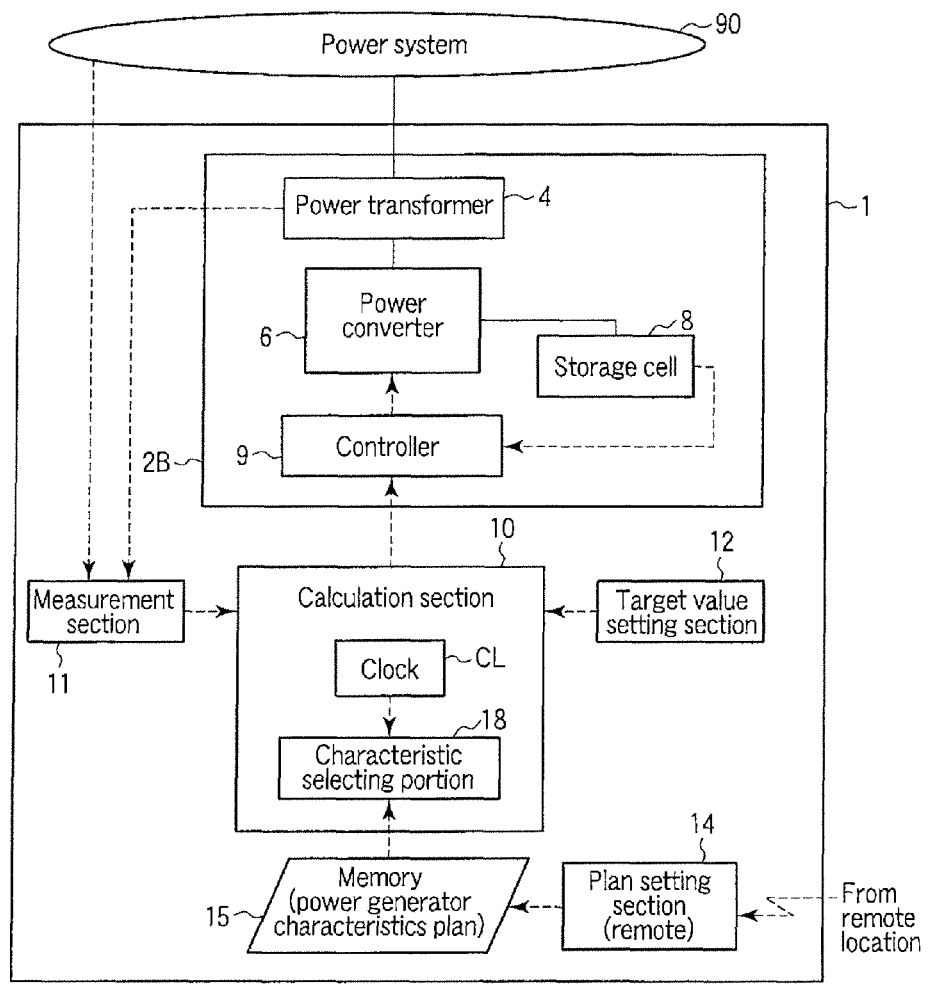
F I G. 5B

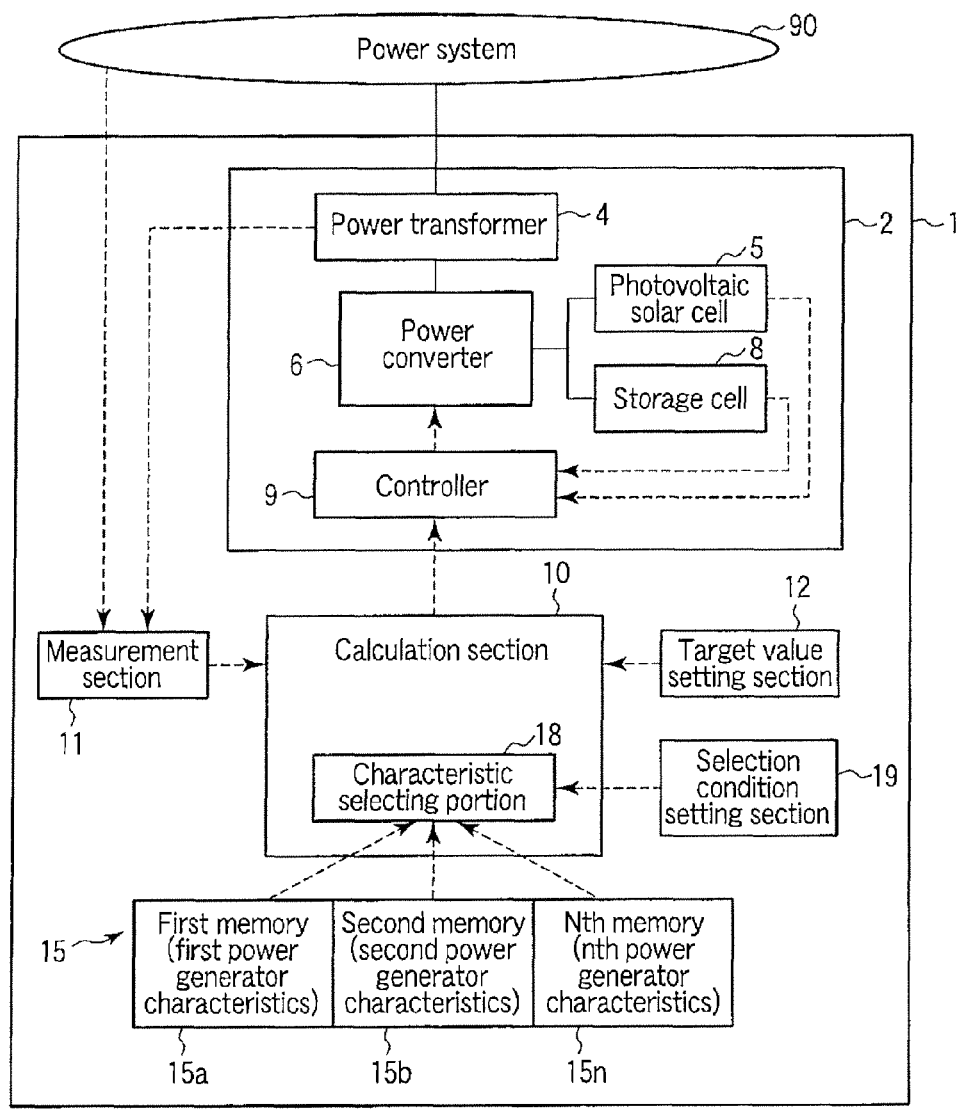
F I G. 6A

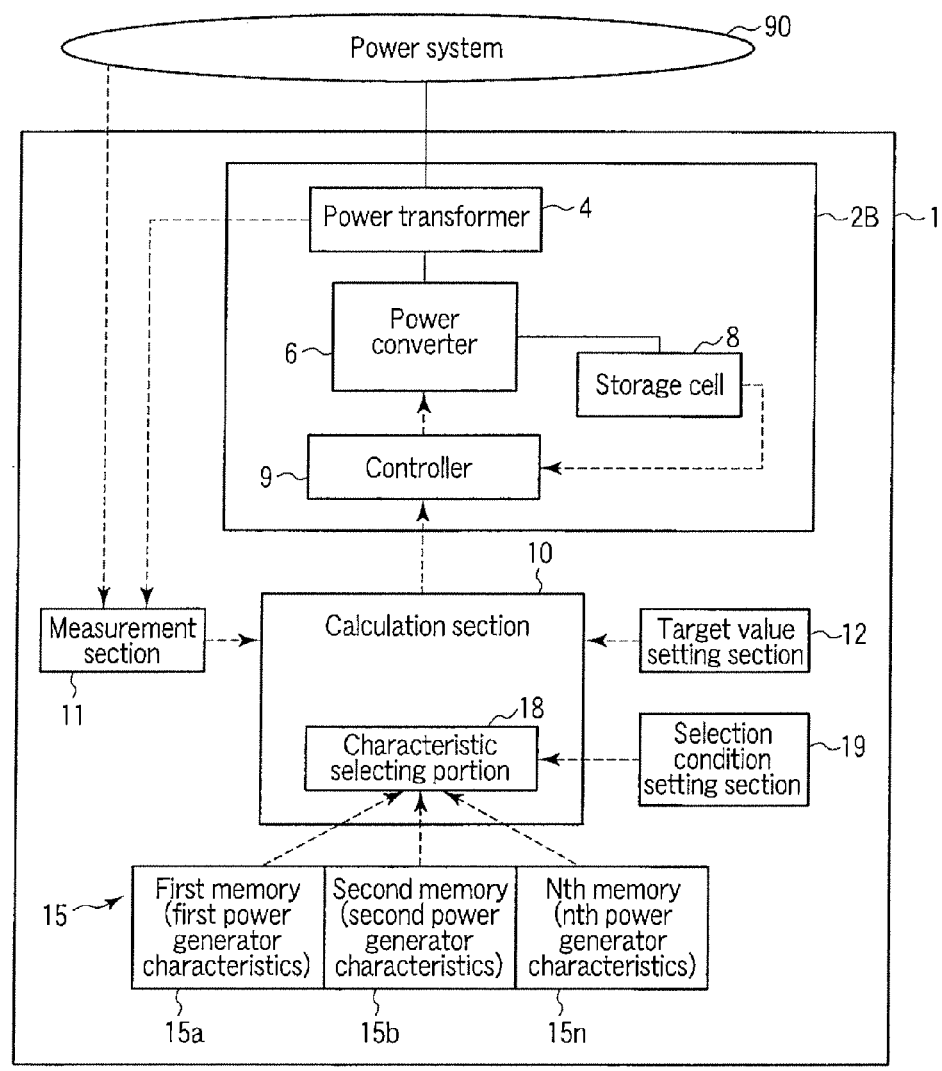
F I G. 6B

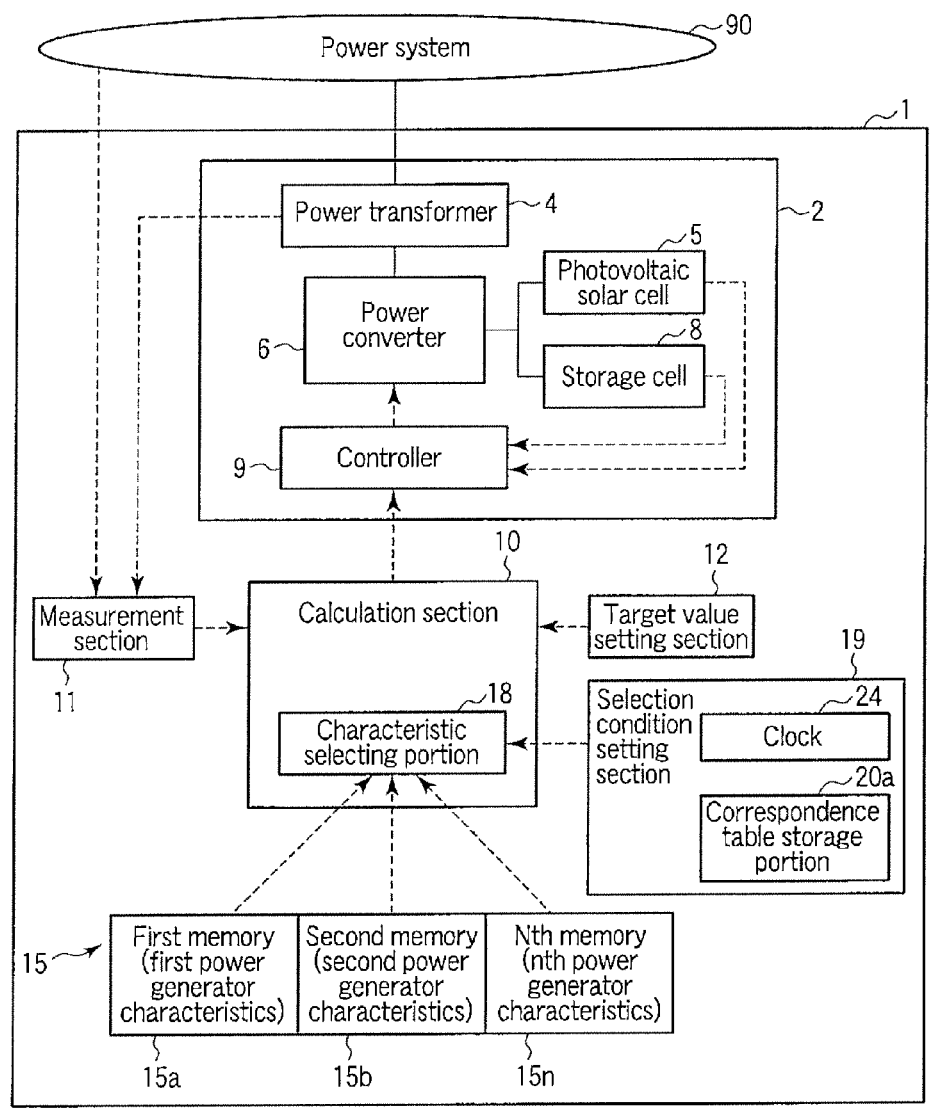
F I G. 10A

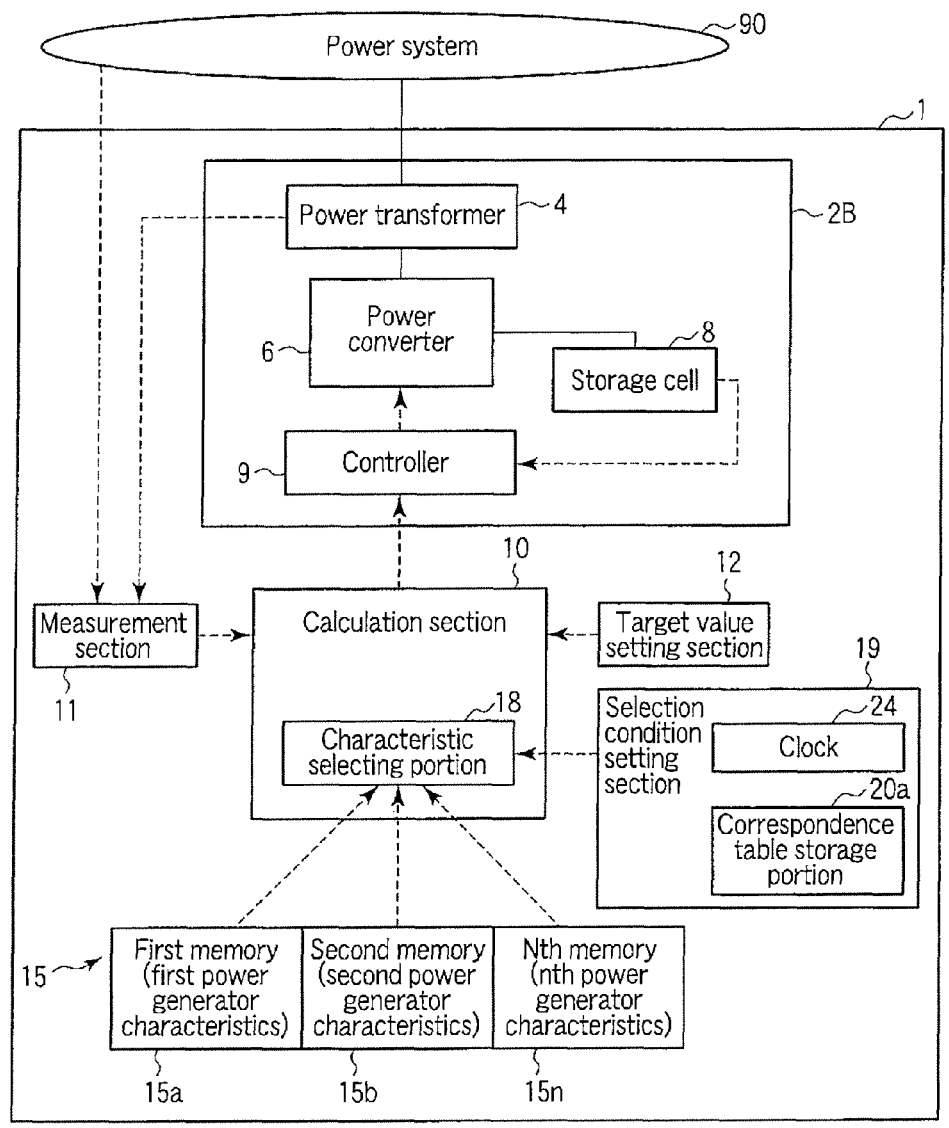
F I G. 10B

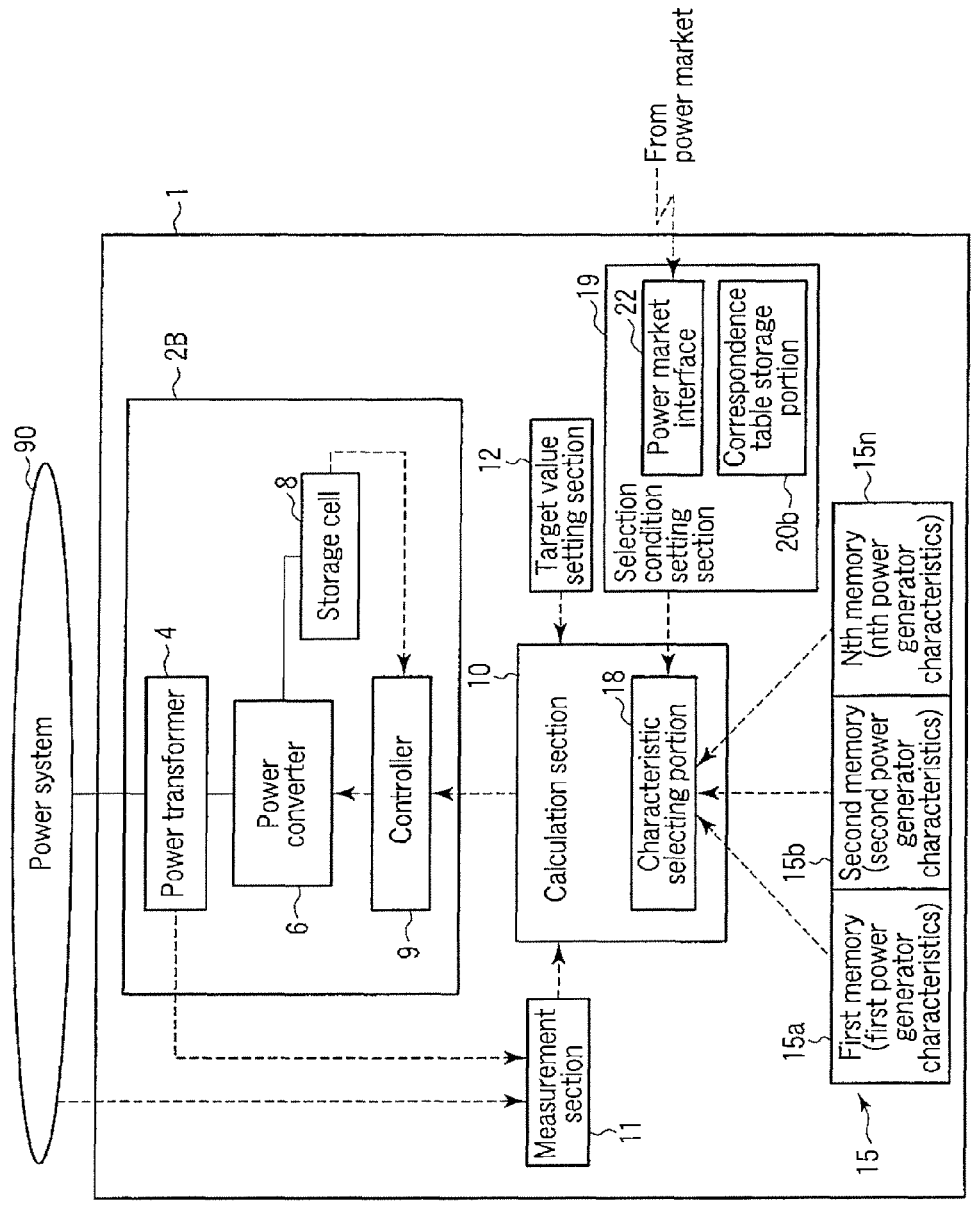
F I G. 11B

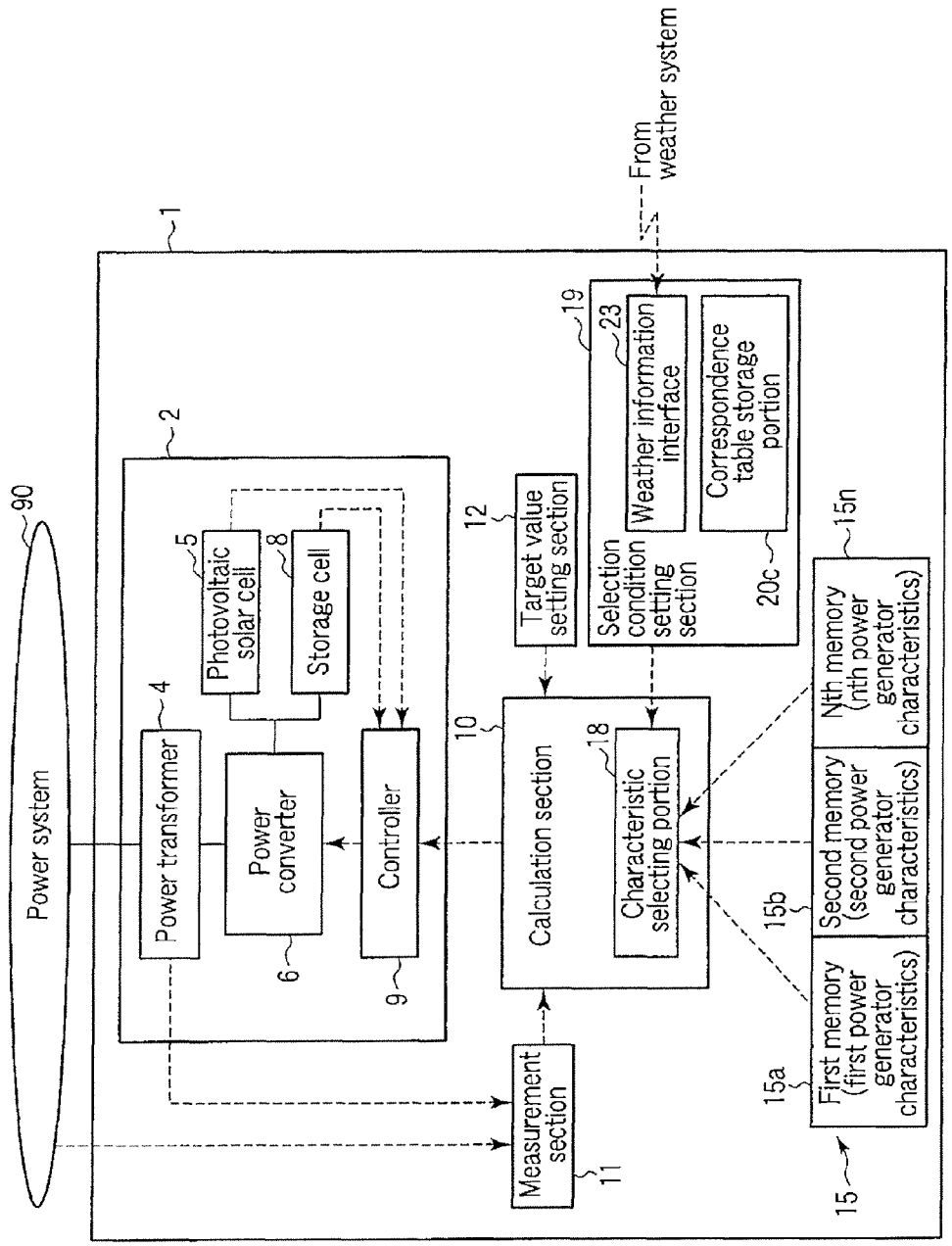
F I G. 12A

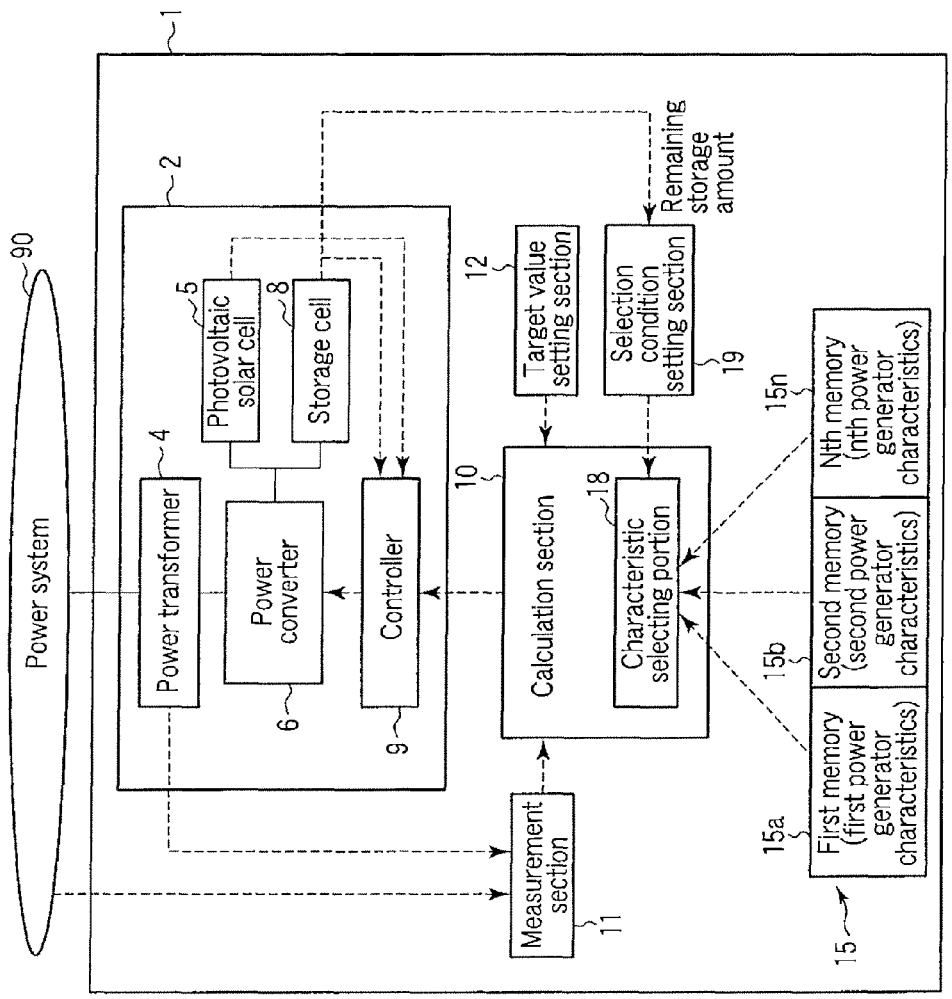
F I G. 13A

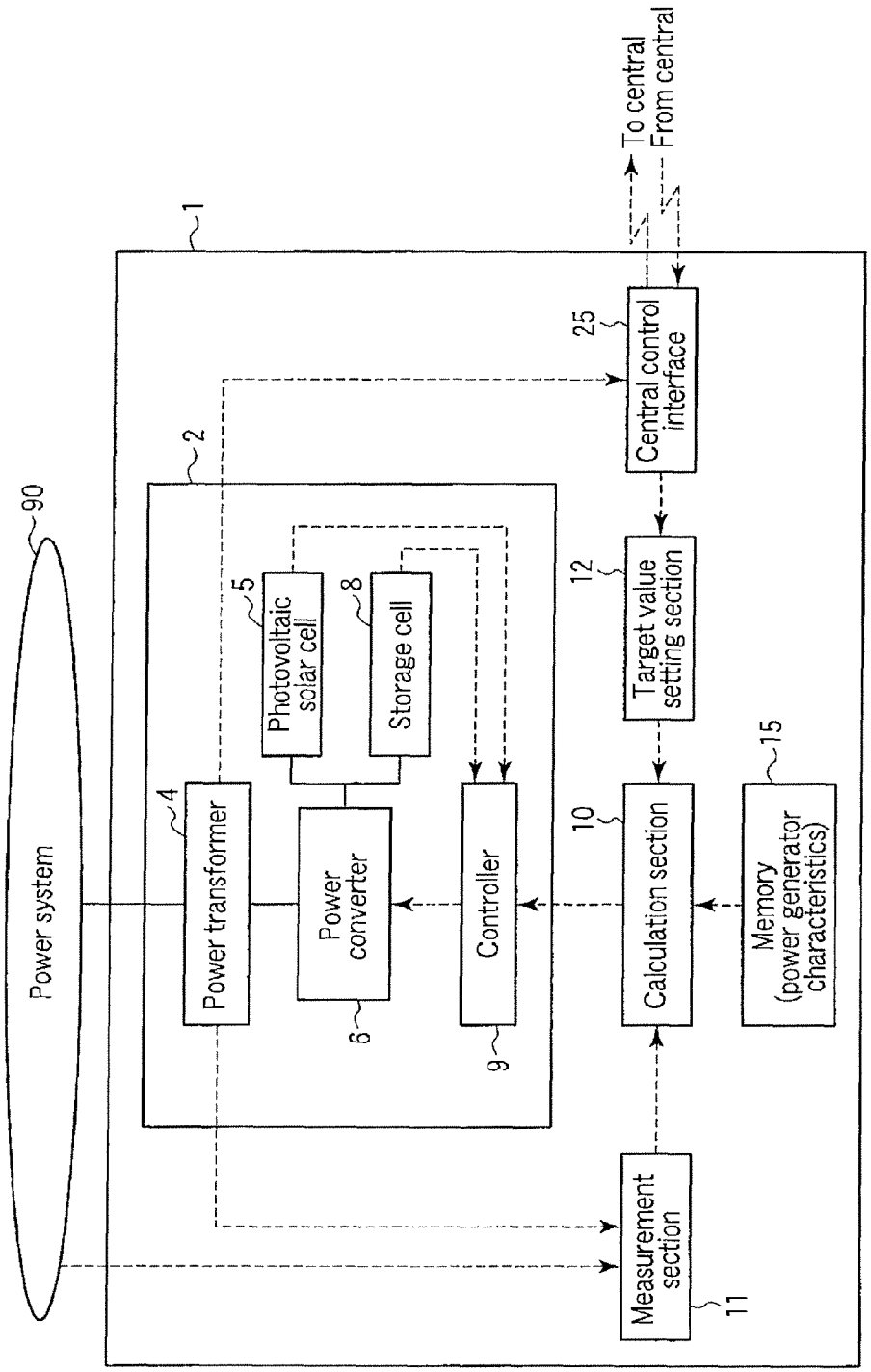
F I G. 14A

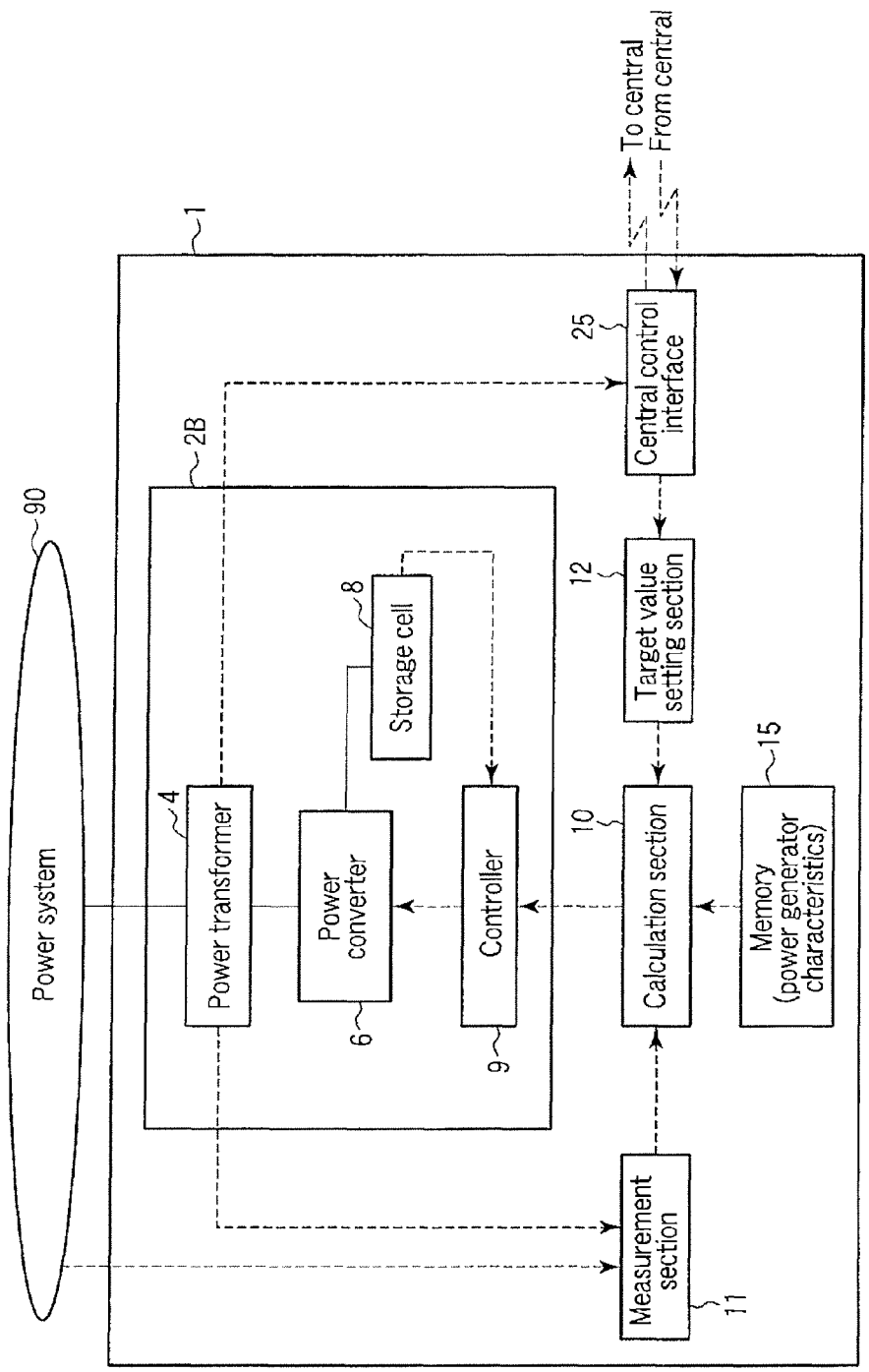
F I G. 14B

PHOTOVOLTAIC SYSTEM AND POWER SUPPLY SYSTEM

CROSS REFERENCE TO RELATED APPLICATIONS

This application is a Continuation application of PCT Application No. PCT/JP2011/053068, filed Feb. 15, 2011 and based upon and claiming the benefit of priority from prior Japanese Patent Application No. 2010-054919, filed Mar. 11, 2010, the entire contents of all of which are incorporated herein by reference.

FIELD

Embodiments described herein relate generally to a photovoltaic system and a power supply system capable of operating in cooperation with a synchronous power generator such as a fuel generator interconnected to a power system.

BACKGROUND

The photovoltaic system is expected to become a "zero emission power supply" as greenhouse effect gas is not discharged during power generation, and is being planned to be introduced in large amount in the future throughout the world.

For instance, patent document 1 (Jpn. Pat. Appln. KOKAI Publication No. 2007-274841) discloses a photovoltaic system and a photovoltaic plant comprising a solar battery array including a plurality of solar batteries, an inverter that converts the DC (direct current) power output from the solar battery array to the AC (alternating current) power, and a step-up transformer that steps up the AC power output from the inverter to high voltage. In the photovoltaic system having such configuration, the output is desired to be smoothened since the output fluctuates due to change in weather.

Patent document 2 (Japanese Patent No. 4170565) discloses a dispersed power supply system including: a power fluctuation smoothening device with a power storing unit, a charging/discharging unit, and a control unit; a dispersed power supply such as a photovoltaic solar cell; and a power converting device of a system interconnected type. In the dispersed power supply system having such configuration, the power storing unit is discharged when the output of the dispersed power supply is reduced and the power storing unit is charged when the output of the dispersed power supply is increased to thereby smooth the output.

In the synchronous power generator such as a fuel generator and a hydraulic generator that supplies power to the power system, the power generator characteristics of the power generator are fixedly defined once designed and manufactured. However, the conventional photovoltaic system and the power supply system that supplies the DC power and converts to the AC for output do not have the power generator characteristics of the synchronous power generator. The reasons thereof lie in that the conventional photovoltaic system and the like do not include a rotating portion such as the synchronous power generator, do not include a device for speed governing, and do not include a device of a so-called excitation system such as a voltage adjustment device.

Therefore, the conventional photovoltaic system and the power supply system cannot contribute to stable operation, that is, maintaining of stability, maintaining of frequency, and maintaining of voltage of the power system in cooperation with the synchronous power generator already introduced.

BRIEF DESCRIPTION OF THE DRAWINGS

FIG. 1B is a block diagram schematically showing a configuration of a power supply system according to the first example.

FIG. 2A is a block diagram schematically showing a configuration of a photovoltaic system according to a second example.

FIG. 2B is a block diagram schematically showing a configuration of a power supply system according to the second example.

FIG. 3A is a block diagram schematically showing a configuration of a photovoltaic system according to a third example.

FIG. 3B is a block diagram schematically showing a configuration of a power supply system according to the third example.

FIG. 4A is a block diagram schematically showing a configuration of a photovoltaic system according to a fourth example.

FIG. 4B is a block diagram schematically showing a configuration of a power supply system according to the fourth example.

FIG. 5A is a block diagram schematically showing a configuration of a photovoltaic system according to a fifth example.

FIG. 5B is a block diagram schematically showing a configuration of a power supply system according to the fifth example.

FIG. 6A is a block diagram schematically showing a configuration of a photovoltaic system according to a sixth example.

FIG. 6B is a block diagram schematically showing a configuration of a power supply system according to the sixth example.

FIG. 10A is a block diagram schematically showing a configuration of a photovoltaic system according to an eleventh example.

FIG. 10B is a block diagram schematically showing a configuration of a power supply system according to the eleventh example.

FIG. 11B is a block diagram schematically showing a configuration of a power supply system according to the twelfth example.

FIG. 12A is a block diagram schematically showing a configuration of a photovoltaic system according to a thirteenth example.

FIG. 13A is a block diagram schematically showing a configuration of a photovoltaic system according to a fourteenth example.

FIG. 14A is a block diagram schematically showing a configuration of a photovoltaic system according to a modification.

FIG. 14B is a block diagram schematically showing a configuration of a power supply system according to the modification.

DETAILED DESCRIPTION

Figure 1A:
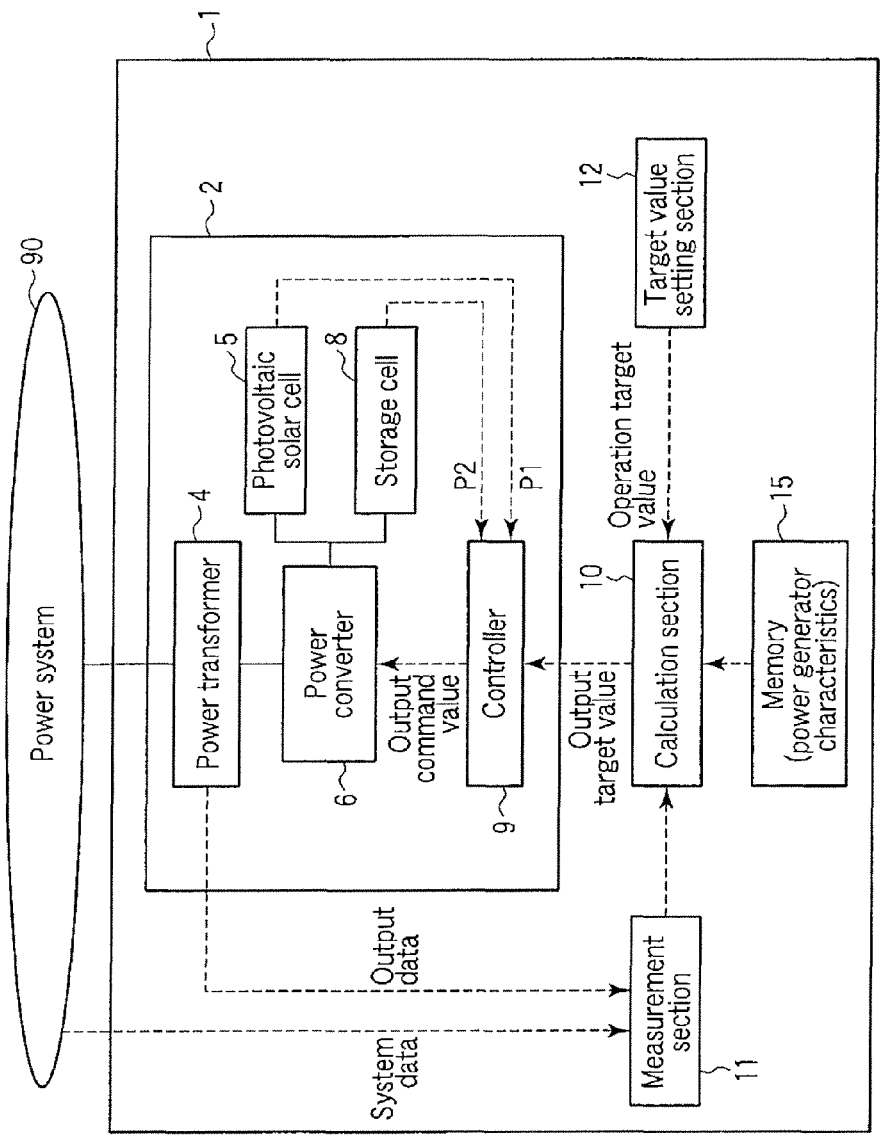
FIG. 1A is a block diagram schematically showing a configuration of a photovoltaic system according to a first example.

In general, according to one embodiment, a photovoltaic system capable of supplying power to a power supply system, includes a memory configured to store power generator characteristics to be applied to the photovoltaic system; a measurement section configured to measure system data of the power system to which the photovoltaic system couples, and output data from the photovoltaic system to the power system; a target value setting section configured to accept a setting of an operation target value of the photovoltaic system; a calculation section configured to calculate an output target value to be output by the photovoltaic system using the power generator characteristics read from the memory, the operation target value transmitted from the target value setting section, and the system data and the output data transmitted from the measurement section; and a photovoltaic section including a photovoltaic solar cell, a storage cell, and a power converter configured to convert an electric energy output from the photovoltaic solar cell and the storage cell to a power adapted to the power system, the photovoltaic section being configured to supply a corresponding power to the power system based on the output target value calculated by the calculation section.

According to one embodiment, a power supply system capable of supplying power to a power supply system, includes a memory configured to store power generator characteristics to be applied to the power supply system; a measurement section configured to measure system data of the power system to which the power supply system couples, and output data from the power supply system to the power system; a target value setting section configured to accept a setting of an operation target value of the power supply system; a calculation section configured to calculate an output target value to be output by the power supply system using the power generator characteristics read from the memory, the operation target value transmitted from the target value setting section, and the system data and the output data transmitted from the measurement section; and a power supply section including a storage cell and a power converter configured to convert an electric energy output from the storage cell to a power adapted to the power system, the power supply section being configured to supply a corresponding power to the power system based on the output target value calculated by the calculation section.

Embodiments will now be described in detail with reference to the accompanying drawings. In the drawings, structural elements having the same or similar functions are denoted by like reference numerals, and an overlapping description is omitted.

First Example

FIG. 1A is a block diagram schematically showing a configuration of a photovoltaic system 1 according to a first example.

The photovoltaic system 1 is configured to comprise a photovoltaic section 2, a calculation section 10, a measurement section 11, a target value setting section 12, and a memory 15. The photovoltaic section 2 is configured to comprise a power transformer 4, a photovoltaic solar cell 5, a power converter 6, a storage cell 8, and a controller 9.

The memory 15 stores power generator characteristics applied on the photovoltaic system 1. The power generator characteristics referred to herein are the characteristics that determines the behavior of the photovoltaic system 1 at the time of change of an interconnected power system 90 or at the time of change in the setting of the operation target value set by the target value setting section 12. More specifically, the power generator characteristics include 1) power characteristics including a power generator model, a speed governor system model, an excitation system model and characteristic constants of the configuring elements of the respective models; 2) power generator characteristics including synchronizing force or power phase curve; 3) power characteristics including speed adjustment rate; and 4) power characteristics including output change speed and upper and lower limit values of the output.

The measurement section 11 measures the system data of the power system 90 to which the photovoltaic system 1 couples, and the output data from the photovoltaic system 1 to the power system 90. The measurement section 11 outputs the measured system data and output data to the calculation section 10. For instance, the system data is the system frequency of the power system 90, the magnitude and the phase of the voltage of the interconnection point, and the like, and the output data is the magnitude, phase, frequency, and the like of the active power and voltage of the photovoltaic system 1.

The target value setting section 12 accepts the setting of the operation target value of the photovoltaic system 1. The target value setting section 12 outputs the set operation target value to the calculation section 10. The operation target value is the active power, voltage, or reactive power, and the like. Such target value setting section 12 is configured by various types of input devices such as a keyboard when enabling the direct input to be accepted at the photovoltaic system 1.

The calculation section 10 calculates the output of the photovoltaic system 1 corresponding to the movement of the supply-demand situation and the like of the power system 90 based on the power generator characteristics. More specifically, the calculation section 10 reads the power generator characteristics from the memory 15. The calculation section 10 then uses the system data and the output data output from the measurement section 11 to calculate the output of the photovoltaic system 1 that conforms to the change in the system data based on the read power generator characteristics and the operation target value output from the target value setting section 12. The method of calculating the change in the output of the photovoltaic system 1 that conforms to the change in the system data is defined according to the type of power generator characteristics. The calculation section 10 calculates the output value of the power generator based on the power generator characteristics, and outputs the calculated output value of the power generator to the photovoltaic section 2 as the output target value to be output by the photovoltaic system 1.

The photovoltaic section 2 supplies the power corresponding to the output target value of the photovoltaic system 1 output from the calculation section 10 to the power system 90.

In other words, the photovoltaic solar cell 5 converts the energy from sunlight to the DC power. The storage cell 8 stores the DC power converted by the photovoltaic solar cell 5 as necessary. The power converter 6 converts the electric energy output from the photovoltaic solar cell 5 and the storage cell 8 to the power adapted to the power system 90.

The controller 9 reads the DC power P1 currently being converted by the photovoltaic solar cell 5, and reads the DC power P2 at which the storage cell 8 can be charged and discharged based on the remaining storage amount of the storage cell 8. The controller 9 outputs an output command value with respect to the power converter 6 based on the output target value output from the calculation section 10.

More specifically, the controller 9 first examines whether or not power corresponding to the output target value can be generated from the DC power P1 and the DC power P2. The controller 9 outputs the output target value to the power converter 6 as the output command value when determining that power can be generated without excess or deficiency with respect to the output target value (that is, a sum of the DC power P1 and the DC power P2 is the output target value or greater). The controller 9 outputs the value obtained by adding the amount that cannot be charged and the output target value to the power converter 6 as the output command value when determining that the DC power P1 is greater than the output target value and the amount exceeding the output target value cannot be completely charged even if charged to the storage cell 8. The controller 9 outputs the value obtained by subtracting the amount that cannot be discharged in the storage cell 8 from the output target value to the power converter 6 as the output command value when determining that the DC power P1 is smaller than the output target value and the amount lacking the output target value cannot be completely discharged in the storage cell 8.

The power converter 6 discharges the lacking amount from the storage cell 8 if the output power from the photovoltaic solar cell 5 is lacking with respect to the output command value output from the controller 9, and charges the exceeding amount to the storage cell 8 if the output power from the photovoltaic solar cell 5 is exceeding with respect to the output command value. The power converter 6 converts the DC power or the output power from the photovoltaic solar cell 5 and the DC power discharged from the storage cell 8 as necessary to the AC power, and transmits the converted AC power to the power transformer 4.

The power transformer 4 is interconnected with the power system 90, and thus supplies the AC power received from the power converter 6 to the power system 90.

The configuration of the photovoltaic section 2 described above merely needs to include at least the photovoltaic solar cell 5, the storage cell 8, and the power converter 6, and is not limited to the example shown in FIG. 1A as long as it has the function of receiving the output target value from the calculation section 10, and generating power so that the output of the photovoltaic system 1 becomes the output target value. The photovoltaic solar cell 5, the storage cell 8, and the power converter 6 are not limited to a specific configuration and merely need to be able to achieve the above-described functions.

As shown in FIG. 1B, the first example may provide a power supply system 1 comprising a power supply section 2B that does not include the photovoltaic solar cell.

The storage cell 8 stores power from the power system 90. The controller 9 reads the DC power P2, which the storage cell 8 can charge and discharge, based on the remaining storage amount of the storage cell 8, and outputs the output command value with respect to the power converter 6 based on the output target value output from the calculation section 10.

More specifically, the controller 9 first examines whether or not the power corresponding to the output target value can be output based on the DC power P2. If determined that the output can be made without excess or deficiency with respect to the output target value (that is, DC power P2 is the output target value or greater), the controller 9 outputs the output target value to the power converter 6 as the output command value. If determined that the storage amount of the storage cell 8 is lacking with respect to the output target value (that is, DC power P2 is smaller than the output target value), the controller 9 outputs the value in which the amount that cannot be discharged in the storage cell 8 is subtracted from the output target value to the power converter 6 as the output command value.

The power converter 6 discharges the storage cell 8 according to the output command value output from the controller 9, and stores the amount exceeding the output command value in the storage cell 8 if sufficient with respect to the output command value. The power converter 6 converts the DC power discharged from the storage cell 8 to the AC power, and sends the converted AC power to the power transformer 4. The power transformer 4 supplies the AC power received from the power converter 6 to the power system 90. In this case, the above process is applied not only when the power is supplied from the storage cell 8 to the power system 90, but also when the power is supplied from the power system 90 to the storage cell 8.

According to the first example, the photovoltaic system and the power supply system 1 having the power generator characteristics equivalent to the synchronous power generator are realized although the rotating portion such as the synchronous power generator including the fuel generator and the hydraulic generator, the device of the speed governor system, the device of the excitation system, and the like are not arranged. In other words, the photovoltaic system and the power supply system 1 of the first example store the power generator characteristics equivalent to the synchronous power generator in the memory 15 in advance. Thus, the output target value is not simply calculated based on the operation target value set by the target value setting section 12, but the output target value that conforms to the change in the system data is calculated based on the power generator characteristics stored in the memory 15 and the operation target value set by the target value setting section 12. Therefore, the photovoltaic section and the power supply section supply the AC power that takes the power generator characteristics into consideration to the power system 90. According to the photovoltaic system and the power supply system 1 having such function, stable operation, that is, maintaining of stability, maintaining of frequency, and maintaining of voltage of the power system 90 are contributed in cooperation with the synchronous power generator that is already introduced.

Second Example

FIG. 2A is a block diagram schematically showing a configuration of a photovoltaic system 1 according to a second example.

The configuration of the photovoltaic system 1 according to the second example differs from the first example in comprising a characteristic setting section 16 that accepts the direct input of the power generator characteristics stored in the memory 15. Other configurations are the same as the configurations shown in FIG. 1A.

The general photovoltaic system does not have the power generator characteristics equivalent to the synchronous power generator. The synchronous power generator only has the power generator characteristics fixedly defined in the designing and manufacturing stage, and the power generator characteristics cannot be changed after the operation, the power generator characteristics cannot be newly set, and the power generator characteristics cannot be reset to change.

In the second example, the photovoltaic system 1 having the power generator characteristics equivalent to the synchronous power generator is provided, and the photovoltaic system 1 in which the power generator characteristics can be set and the power generator characteristics can be changed as necessary is provided.

This will be more specifically described below.

The characteristic setting section 16 is configured by various types of input devices such as a keyboard.

As shown in FIG. 2B, the second example can provide a power supply system 1 comprising a power supply section 2B that does not include the photovoltaic solar cell.

According to such second example, the power generator characteristics can be freely set within a range of restriction such as the capacity of the photovoltaic solar cell 5 and the storage cell 8, and the once set power generator characteristics can be changed to the fitted power generator characteristics according to the system situation and the operation environment, in addition to the effects by the first example.

According to the second example, the photovoltaic system and the power supply system 1 in which the power generator characteristics can be set and changed through the characteristic setting section 16 can be realized. In other words, the power generator characteristics cannot be changed after the operation and the new power generator characteristics cannot be set in the synchronous power generator, but the functions difficult to realize in the synchronous power generator are realized in the photovoltaic system and the power supply system 1 according to the second example.

Third Example

FIG. 3A is a block diagram schematically showing a configuration of a photovoltaic system 1 according to a third example.

The configuration of the photovoltaic system 1 according to the third example differs from the second example in comprising a characteristic setting section 17 that accepts the remote input of the power generator characteristics through a communication line in place of the characteristic setting section 16 that accepts the direct input of the power generator characteristics. Other configurations are the same as the configurations shown in FIG. 2A.

The characteristic setting section 17 couples with the system or the terminal at a distant location to accept the power generator characteristics from the remote location.

As shown in FIG. 3B, the third example may provide a power supply system 1 comprising a power supply section 2B that does not include the photovoltaic solar cell.

The third example is extremely advantageous as the power generator characteristics are set by communication from the system or the terminal of the remote location in addition to the effects by the second example. In particular, the power generator characteristics are managed in a concentrated manner from one location with respect to a plurality of photovoltaic systems and power supply systems 1.

Fourth Example

FIG. 4A is a block diagram schematically showing a configuration of a photovoltaic system 1 according to a fourth example.

The configuration of the photovoltaic system 1 according to the fourth example differs from the second example in comprising a plan setting section 13 in place of the characteristic setting section 16 that accepts the direct input of the power generator characteristics, and in that the calculation section 10 includes a clock CL and a characteristic selecting portion 18. Other configurations are the same as the configurations shown in FIG. 2A.

The power generator having the idea of changing the power generator characteristics during the operation does not exist in the power generators introduced up to now, and thus the idea of setting a plan of the power generator characteristics to adopt in the power generator in advance and operating based on such plan is not considered.

In the fourth example, the photovoltaic system 1 that behaves according to the changed power generator characteristics, the power generator characteristics being automatically changed according to the plan of the power generator characteristics set in advance, is provided.

This will be more specifically described below.

The plan setting section 13 accepts the setting of a plan of the power generator characteristics of the photovoltaic system 1. The plan defines the schedule of the future power generator characteristics to give to the photovoltaic system 1, and shows what kind of power generator characteristics to give and when. More specifically, the plan setting section 13 is configured by various types of input devices such as a keyboard. The plan setting section 13 accepts the direct input of the plan of the power generator characteristics corresponded to time. The plan of the power generator characteristics set by the plan setting section 13 is stored in the memory 15.

The clock CL ticks time. The characteristic selecting portion 18 is configured to read the current time from the clock CL. The characteristic selecting portion 18 reads the current time from the clock CL, and also references the plan of the power generator characteristics stored in the memory 15 to select the power generator characteristics to be given to the photovoltaic system 1 corresponded to the current time along the plan from the memory 15.

In the calculation section 10 configured to include the clock CL and the characteristic selecting portion 18, the output target value is calculated using the power generator characteristics selected by the characteristic selecting portion 18, the operation target value output from the target value setting section 12, and the system data and the output data measured by the measurement section 11, and the output target value is output to the photovoltaic section 2. That is, the power generator characteristics is automatically changed based on the plan of the power generator characteristics set in advance in the calculation section 10.

As shown in FIG. 4B, the fourth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to the fourth example, the photovoltaic system and the power supply system 1 that behave based on the power generator characteristics according to the plan can be realized in addition to the effects by the second example. For instance, the photovoltaic system and the power supply system 1 that contribute to the stable operation of the system operation are realized by setting the plan of the suitable power generator characteristics along the fluctuation prediction of the power load.

Fifth Example

FIG. 5A is a block diagram schematically showing a configuration of a photovoltaic system 1 according to a fifth example.

The configuration of the photovoltaic system 1 according to the fifth example differs from the fourth example in comprising a plan setting section 14 that accepts the remote input of a plan of the power generator characteristics through a communication line in place of the plan setting section 13 that accepts the direct input of the plan of the power generator characteristics. Other configurations are the same as the configurations shown in FIG. 4A.

The plan setting section 14 couples with the system or the terminal at a distant location to accept the plan of the power generator characteristics from the remote location.

As shown in FIG. 5B, the fifth example may provide a power supply system 1 comprising a power supply section 2B that does not include the photovoltaic solar cell.

The fifth example is extremely advantageous as the plan of the power generator characteristics is set by communication from the system or the terminal of the remote location in addition to the effects by the fourth example. In particular, the plan of the power generator characteristics is managed in a concentrated manner from one location with respect to a plurality of photovoltaic systems and power supply system 1.

Sixth Example

FIG. 6A is a block diagram schematically showing a configuration of a photovoltaic system 1 according to a sixth example.

The configuration of the photovoltaic system 1 according to the sixth example differs from the second example in comprising a selection condition setting section 19 in place of the characteristic setting section 16, and in that the calculation section 10 includes a characteristic selecting portion 18. Other configurations are the same as the configurations shown in FIG. 2A.

The power generator having the idea of changing the power generator characteristics during the operation does not exist in the power generators introduced up to now, and thus the idea of setting a plurality of power generator characteristics in the power generator in advance, autonomously selecting the characteristics suited for the operation environment at the time, and operating in the selected power generator characteristics is not considered.

The sixth example may provide a photovoltaic system 1, in which the power generator characteristics is autonomously selected according to the operation environment at the relevant time point from the plurality of power generator characteristics set in advance, and the photovoltaic system 1 behaves according to the selected power generator characteristics.

This will be more specifically described below.

In the illustrated example, the memory 15 is configured by a first memory 15a that stores first power generator characteristics, a second memory 15b that stores second power generator characteristics, . . . , and an $n^{th}$ memory 15n that stores $n^{th}$ power generator characteristics (n is a positive integer). Each of the power generator characteristics is corresponded to a memory identifier unique to each memory. The configuration of the memory 15 does not need to be such that the first memory 15a, the second memory 15b, . . . are separately arranged, and the single memory 15 may be configured to include the storage region corresponding to the first memory 15a, the second memory 15b, . . . . Although the memory identifier is corresponded with respect to the power generator characteristics, the unique identifier may be corresponded with respect to each of the power generator characteristics. Such memory 15 is not limited to a specific configuration and merely needs to achieve the function of storing a plurality of power generator characteristics corresponded to each unique identifier.

The selection condition setting section 19 sets the identifier (memory identifier in the illustrated example) for selecting the power generator characteristics to be selected according to the selection condition of the plurality of power generator characteristics stored in the memory 15. The selection condition setting section 19 outputs the set identifier to the calculation section 10. The selection condition indicates the relationship of the condition in which the characteristics of the photovoltaic system 1 can be exhibited and the power generator characteristics corresponding to the relevant condition such as the correspondence condition of time and memory identifier, the correspondence condition of electrical power charge of the power market and memory identifier, and the correspondence condition of weather condition and memory identifier.

The characteristic selecting portion 18 of the calculation section 10 selects the power generator characteristics to give to the photovoltaic system 1 corresponded to the identifier set by the selection condition setting section 19 from the memory 15 of the plurality of power generator characteristics stored in the memory 15. For instance, the characteristic selecting portion 18 selects the first memory 15a and selects the first power generator characteristics stored in the selected first memory 15a as the desired power generator characteristics in the case where the identifier corresponding to the first memory 15a is set as the memory identifier by the selection condition setting section 19.

In the calculation section 10 configured to include such characteristic selecting portion 18, the output target value is calculated by using the power generator characteristics selected by the characteristic selecting portion 18, the operation target value output from the target value setting section 12, and the system data and the output data measured by the measurement section 11, and the output target value is output to the photovoltaic section 2. That is, in the calculation section 10, the power generator characteristics is autonomously selected along the condition sent from the selection condition setting section 19 when selecting one of the power generator characteristics from the plurality of power generator characteristics stored in the memory 15.

As shown in FIG. 6B, the sixth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such sixth example, the photovoltaic system and the power supply system 1, in which the power generator characteristics suited for the operation environment is autonomously selected and changed by the selection condition, that behave according to the selected power generator characteristics can be provided, in addition to the effects of the second example. For instance, the power generator characteristics having small synchronizing power may be used in the time band where the fuel generator is greatly operated, and the power generator characteristics having large synchronizing power may be used when the fuel generator is operating only slightly, so that the photovoltaic system and the power supply system 1 that contribute to stable operation of the system are realized.

Seventh Example

The configuration of a photovoltaic system 1 according to a seventh example is the same as the block diagram shown in FIG. 6A. A configuration of a power supply system 1 according to the seventh example is the same as the block diagram shown in FIG. 6B. However, each of first power generator characteristics stored in the first memory 15a, second power generator characteristics stored in the second memory 15b, . . . , and $n^{th}$ power generator characteristics stored in the $n^{th}$ memory 15n includes a power generator model, a speed governor system model, an excitation system model, and the characteristic constants of the configuring elements of the respective models.

The power generator model, the speed governor system model, the excitation system model, and the respective characteristic constants are originally considered to accurately simulation calculate the behavior of the synchronous power generator, and may be considered as one type of power generator characteristics. Such power generator characteristics are unique to the power generator at the time point the power generator is designed and manufactured, and thus are not set or changed thereafter. Furthermore, the power generator characteristics shown in the power generator model, the speed governor system model, and the excitation system model as with the synchronous power generator do not exist in the photovoltaic system since the rotation device, the speed governor, the voltage adjustment device, and the like are not arranged. Therefore, the photovoltaic system of setting a plurality of power generator characteristics in advance and selecting one of the power generator characteristics therefrom to behave based on the selected power generator characteristics does not exist. Thus, the conventional photovoltaic system cannot contribute to stable operation of the system, specifically, maintaining stability, maintaining frequency, and maintaining voltage of the power system while cooperating with the synchronous power generator.

In the seventh example, a photovoltaic system 1 in which the power generator characteristics expressed with the power generator model, the speed governor system model, the excitation system model and the respective characteristic constants are set in plurals in advance, and the desired power generator characteristics corresponding to the operation environment at the relevant time point is autonomously selected from the plurality of power generator characteristics to behave same as the synchronous power generator based on the selected power generator characteristics is realized. The photovoltaic system 1 that contributes to stable operation of the power system 90 is thus provided.

This will be more specifically described below.

The effects of the characteristic selecting portion 18 and the selection condition setting section 19 are the same as the sixth example. The measurement section 11 measures the system data including the frequency of the power system 90 and the magnitude and the phase of the voltage at the interconnection point, as well as the output data including the magnitude and the phase of the active power and the voltage of the photovoltaic system 1. The measurement section 11 outputs the measured system data and the output data to the calculation section 10.

The calculation section 10 calculates the output target value of the photovoltaic system 1 corresponding to the movement of the power system 90 based on the power generator characteristics selected by the characteristic selecting portion 18. One example of such calculation method will be described below.

First, the calculation section 10 calculates the change in output of the photovoltaic system 1 according to the change of the power system 90 using the system data and the output data sent from the measurement section 11 based on the power generator characteristics selected by the characteristic selecting portion 18. There are various methods of calculating the change in output of the photovoltaic system 1 according to the change of the power system 90, one of which is a stability calculation or a representative system analysis calculation method, for example. The stability calculation analyzes how the power generator behaves with respect to the fluctuation of the power system 90, and includes a stability calculation called the Y method by way of example.

The stability calculation represented by the Y method calculates how the power generator responds with respect to change of the power system 90 over a few seconds to a few hundred seconds by 100 milliseconds, for example, and is a general system analyzing method. The calculation section 10 periodically calculates the stability calculation every two seconds, for example, assumes the difference of the system data two seconds before and the current system data as change of the power system 90 for every calculation period, and calculates the output of the photovoltaic system 1 from the state of the photovoltaic system 1 two seconds before to two seconds after, that is, the current at an interval of 100 milliseconds based on the power generator characteristics to determine the calculation value of the current output as the current output target value of the relevant photovoltaic system 1.

Figure 7:
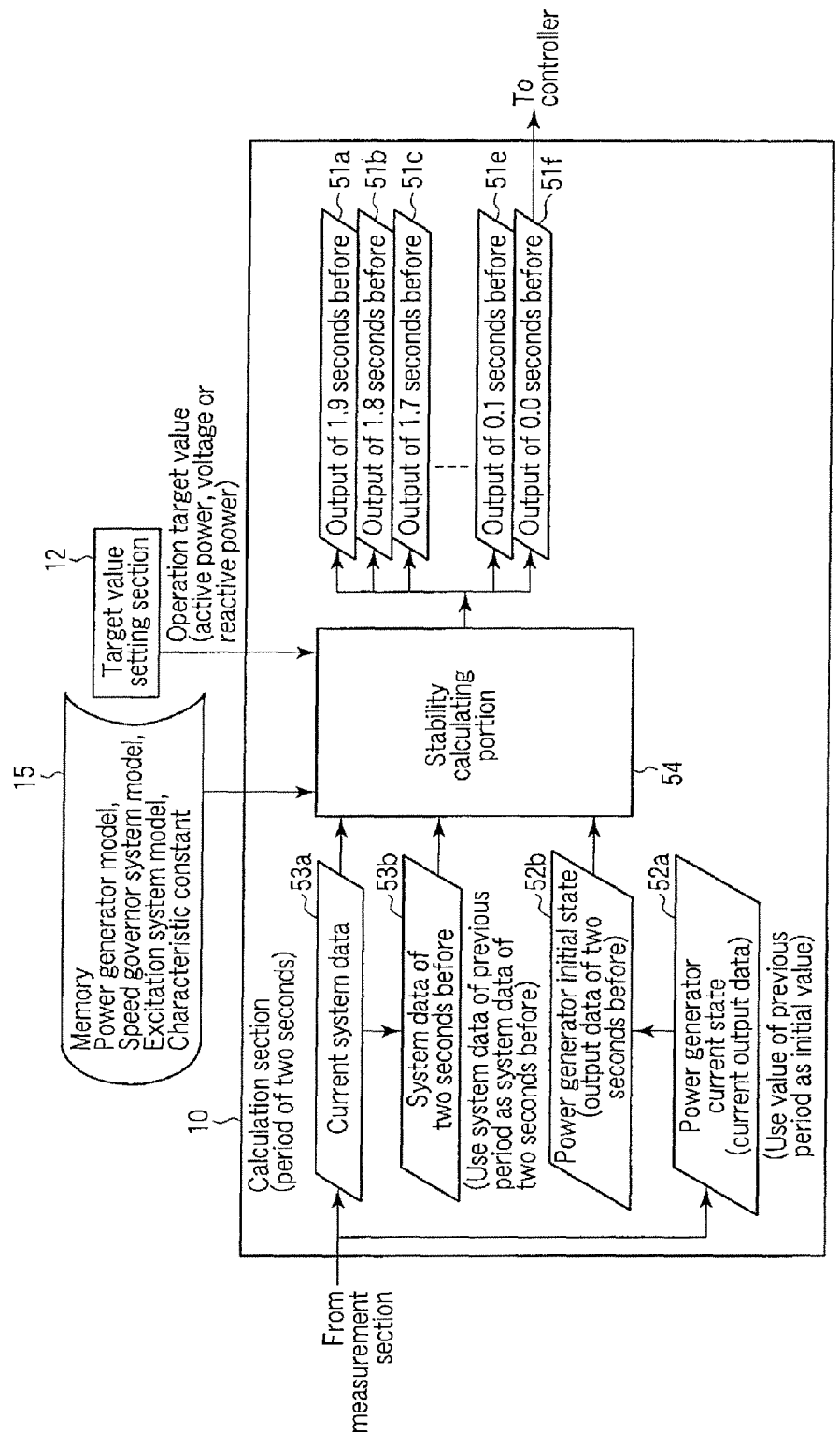
FIG. 7 is a view showing one example of a processing block diagram of a calculation section of a photovoltaic system according to a seventh example.

FIG. 7 shows an example of a processing block diagram of the calculation section 10. The calculation section 10 includes a stability calculating portion 54, a system data memory 53a, a system data memory 53b, a power generator current state memory 52a, a power generator initial state memory 52b, an output memory 51a that stores the output of 1.9 seconds before, an output memory 51b that stores the output of 1.8 seconds before, an output memory 51c that stores the output of 1.7 seconds before, . . . , an output memory 51e that stores the output of 0.1 second before, and an output memory 51f that stores the output of 0.0 second before.

The system data memory 53a stores the current system data including the frequency of the power system 90, and the magnitude and the phase of the voltage of the interconnection point transmitted by the measurement section 11. The system data memory 53b stores the system data of two seconds before transmitted by the measurement section 11. The power generator current state memory 52a stores the current output data of the photovoltaic system 1 transmitted by the measurement section 11. The power generator initial state memory 52b stores the output data of the photovoltaic system 1 of two seconds before as the power generator initial state.

The stability calculating portion 54 reads the selected power generator characteristics from the memory 15, and sets the output data of two seconds before of the photovoltaic system 1 stored in the power generator initial state memory 52b as the initial value. The stability calculating portion 54 calculates the behavior of the photovoltaic system 1 by 0.1 second with respect to the respective amount of change of the magnitude and the phase of the voltage of the power system 90 based on the content of the system data of two seconds before stored in the system data memory 53b and the current system data stored in the system data memory 53a.

In other words, the stability calculating portion 54 calculates the output value of 1.9 seconds before with respect to power generator initial state of two seconds before, and stores the calculation result in the output memory 51a. Subsequently, the stability calculating portion 54 calculates the output value of 1.8 seconds before from the output value of 1.9 seconds before, and stores the calculation result in the output memory 51b, and thereafter, sequentially calculates the output value of 1.7 seconds before and stores the calculation result in the output memory 51c, calculates the output value of 0.1 second before and stores the calculation result in the output memory 51e, and calculates the output value of 0.0 second before and stores the calculation result in the output memory 51f. The stability calculating portion 54 sets the content of the output memory 51f of 0.0 second before as the output target value to be currently obtained. The calculation section 10 comprising such stability calculating portion 54 outputs the set output target value to the photovoltaic section 2.

The stability calculating portion 54 copies the current system data stored in the system data memory 53a to the system data memory 53b and also copies the current output data of the photovoltaic system 1 stored in the power generator current state memory 52a to the power generator initial state memory 52b for the calculation of next time. The calculation section 10 thereby repeats the determination of the current output value of the power generator suited for the power generator characteristics, and the transmission of the determined output value of the power generator to the photovoltaic section 2 in a period of two seconds as the output target value of the photovoltaic system 1.

A case in which the calculation section 10 uses the stability calculation is considered in the above description, but the power generator model, the speed governor system model, and the excitation system model may be formed to simple models to repeatedly carry out input of the system data and the output data for every few dozen μ seconds to calculate the output target value of the photovoltaic system 1 corresponding to the change in system for a few dozen μ seconds, and transmission of the calculated output target value to the photovoltaic section 2 for every few dozen μ seconds. Others are the same as the effects of the photovoltaic system 1 of the sixth example.

The seventh example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to the seventh example, the photovoltaic system and the power supply system 1 having the power generator characteristics of the same idea as the synchronous power generator are realized, and furthermore, the power generator model, the speed governor system model, the excitation system model, and the characteristic constants of the configuring elements thereof can be freely set within the range of restriction of the capacity of the photovoltaic solar cell 5 and the storage cell 8, and hence the photovoltaic system and the power supply system 1 that contribute to stable operation of the power system 90 in cooperation with other synchronous power generators are realized by setting a plurality of power generator characteristics. Moreover, the power generator model, the speed governor system model, and the excitation system model are finely set, and the behavior based on the power generator characteristics that also take into consideration the dynamic characteristics is realized. Furthermore, contribution is further made to cooperative operation with other synchronous power generators since the power generator characteristics are changed according to the situation of the power system 90.

The power generator characteristics including the power generator model, the speed governor system model, the excitation system model, and the characteristic constants are used to define the strict behavior of the power generator, but there are many cases where the strict behavior of the power generator does not need to be defined. In that case, the behavior of each power generator is modeled and described focusing on a specific function. In eighth to tenth examples below, a case where the power generator characteristics in which the behavior of the power generator is modeled focusing on a specific function is applied for the power generator characteristics is described.

Eighth Example

The configuration of a photovoltaic system 1 according to the eighth example is the same as the block diagram shown in FIG. 6A. A configuration of a power supply system 1 according to the eighth example is the same as the block diagram shown in FIG. 6B. However, each of first power generator characteristics stored in the first memory 15a, second power generator characteristics stored in the second memory 15b, . . . , and $n^{th}$ power generator characteristics stored in the $n^{th}$ memory 15n includes a power phase curve (P–δ curve).

Generally, in the case where the synchronous power generator connected to the power system 90 is synchronously operating and all the power generators are rotating at the same speed, if one of the power generators accelerates for some reason and the rotor position δ advances from the original position, the force of returning it back to the original position acts. In other words, if the mechanical input to the power generator is constant, the active power P or the electrical output of the power generator increases in the case where the rotor position δ is increased. The rotor itself decelerates while radiating the accumulated energy of the rotor by the amount corresponding to the amount of output increase. That is, the power generator carrying out the synchronous operation is designed such that dP/dδ>0. Such power generators are generally attached with various types of control devices such as a voltage adjustment device or a speed governor, but are designed to obtain dP/dδ>0 as whole.

Such dP/dδ is called the synchronizing power. Such synchronizing power is realized by installing various types of control devices such that the rotation energy accumulated by the rotation of the rotor acts as a bearing force with respect to the fluctuation of the load balance of the power system 90. The characteristics of the synchronizing power dP/dδ define the behavior of the power generator. In the eighth example, that in which the behavior of the power generator is modeled focusing on the synchronizing power as one of the power generator characteristics is applied.

Describing a specific example, if a large amount of photovoltaic system is introduced to the power system 90, the synchronizing power may become weak in the power system 90 at the time of light load such as the period in which holidays continue since the supply ratio of the power by the fuel generator reduces, and that is a problem. This is because the synchronizing power of the synchronous power generator operating at the time is defined by the characteristics unique to each power generator and cannot be increased, and the photovoltaic system does not have the synchronizing power. If the supply ratio of the power by the photovoltaic system that does not have the synchronizing power is increased, the synchronous power generator may stop one by one due to lack of synchronizing power of the operating synchronous power generator when some of the power supplies drop due to reasons such as an accident and the power system 90 may not be stably operated. As a countermeasure, the suppression of the photovoltaic generation is assumed to become necessary. Such problem is called the system stabilizing problem.

In the eighth example, the photovoltaic system 1 having the synchronizing power based on the power generator characteristics equivalent to the synchronous power generator is provided, and furthermore, the photovoltaic system 1 of autonomously selecting the power generator characteristics according to the operation environment at the relevant time point from a plurality of power generator characteristics set in advance, and having the synchronizing power based on the selected power generator characteristics is provided.

This will be more specifically described below.

Figure 8:
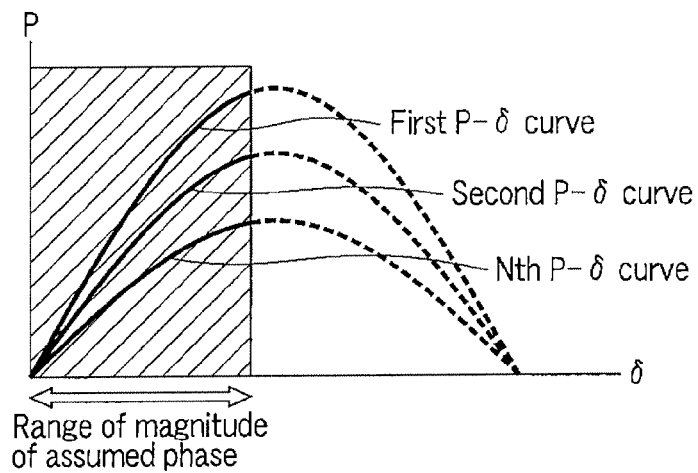
FIG. 8 is a view showing one example of a first power phase curve stored in a first memory, a second power phase curve stored in a second memory, and an $n^{th}$ power phase curve stored in an $n^{th}$ memory of a photovoltaic system according to an eighth example.

FIG. 8 is a view showing an example of a first power phase curve (first P–δ curve) stored in the first memory 15a, a second power phase curve (second P–δ curve) stored in the second memory 15b, and an $n^{th}$ power phase curve ($n^{th}$ P–δ curve) stored in the $n^{th}$ memory 15n. In FIG. 8, the horizontal axis is the phase angle δ of the photovoltaic system 1, and the vertical axis is the active power P output from the photovoltaic system 1.

The rotation energy cannot be stored nor discharged since the photovoltaic system 1 of the eighth example does not include the rotor as well as the voltage adjustment device, the speed governor, and the like. Therefore, the photovoltaic system 1 here comprises a configuration of storing and discharging electric energy by the storage cell 8 and performing the control equivalent to $dP/d\delta>0$ instead of comprising the configuration of performing the control to realize $dP/d\delta>0$. The photovoltaic system 1 having the synchronizing power is thereby realized.

In the photovoltaic system 1 of the eighth example shown in FIG. 6A, the first power phase curve stored in the first memory 15a, the second power phase curve stored in the second memory 15b, and the $n^{th}$ power phase curve stored in the $n^{th}$ memory 15n are set such that the synchronizing power $dP/d\delta$ becomes positive.

The effects of the characteristic selecting portion 18 and the selection condition setting section 19 are the same as the sixth example. The measurement section 11 measures the system data including the magnitude and the phase of the voltage at the interconnection point, as well as the output data including the magnitude and the phase of the active power and the voltage of the photovoltaic system 1. The measurement section 11 outputs the measured system data and the output data to the calculation section 10.

The calculation section 10 periodically implements the following process. In other words, the calculation section 10 compares the phase of the power system 90 at the time of implementation for this time and the phase of the power system 90 at the time of implementation for the previous time, and calculates the difference as $\Delta\delta$. The calculation section 10 then assumes that the phase of the voltage of the photovoltaic system 1 changed by $\Delta\delta$, and calculates the $dP/d\delta$ from the power phase curve selected by the characteristic selecting portion 18. The calculation section 10 calculates the value $\Delta P$ at which the output of the photovoltaic system 1 is to change by $\Delta P = dP/d\alpha \times \Delta\delta$. The calculation section 10 then calculates as the output target value of the photovoltaic system 1 by $P+\Delta P$ using the active power P of the output data at the time of the implementation for the previous time. The calculation section 10 assumes the phase of the output target value as the same as the phase of the voltage of the interconnection point, and outputs the output target value and the phase thereof to the photovoltaic section 2. The calculation section 10 performs such process for every few dozen μ seconds, for example.

Others are the same as the effects of the photovoltaic system 1 of the sixth example. The power converter 6 converts to the AC power having the phase 6 when converting the DC power to the AC power.

The eighth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such eighth example, the photovoltaic system and the power supply system 1 having the synchronizing power as the power generator characteristics of the same idea as the synchronous power generator are realized. Furthermore, since the power generator characteristics suited for the operation environment can be autonomously selected and changed according to the selection condition, the power generator characteristics of small synchronizing power is used when greatly operating the fuel generator, and the power generator characteristics of large synchronizing power is used when operating the fuel generator only slightly. Moreover, since the power generator characteristics is freely set within the range of restriction of the capacity of the photovoltaic solar cell 5 and the storage cell 8, the photovoltaic system and the power supply system 1 that contribute to stable operation of the power system 90 in cooperation with other synchronous power generators are realized by setting a plurality of power generator characteristics.

Ninth Example

A configuration of a photovoltaic system 1 according to a ninth example is the same as the block diagram shown in FIG. 6A. A configuration of the power supply system 1 according to the ninth example is the same as the block diagram shown in FIG. 6B. However, each of first power generator characteristics stored in the first memory 15a, second power generator characteristics stored in the second memory 15b, . . . , and $n^{th}$ power generator characteristics stored in the $n^{th}$ memory 15n includes a velocity adjustment rate that is a function of P (output) and f (frequency).

When the frequency of the power system 90 changes by fluctuation of the system load, the synchronous power generator has the property of automatically changing the output according to the change in frequency so as to stably and continuously operate the power system 90. In other words, the system frequency lowers if the system load is increased, but the synchronous power generator has the property of increasing the output with lowering of the system frequency. The system frequency rises if the system load is reduced, but the synchronous power generator has the property of lowering the output with increase of the system frequency. Such properties are realized by providing the speed governor in the synchronous power generator. Many power generators thus can cooperatively operate with respect to the load fluctuation of the power system 90 to maintain the frequency. Such property is called the velocity adjustment rate. In the ninth example, that in which the behavior of the power generator is modeled focusing on the velocity adjustment rate as one of the power generator characteristics is applied.

Describing a specific example, the photovoltaic system does not have the power generator characteristics such as the velocity adjustment rate since the speed governor is not arranged. If a large amount of photovoltaic system 1 is introduced, the load fluctuation of the power system 90 needs to be responded with only the synchronous power generator with smaller power generation ratio. This is because the photovoltaic system 1 does not have the power generator characteristics of the idea of the velocity adjustment rate.

In the ninth example, the photovoltaic system 1 having the power generator characteristics including the velocity adjustment rate equivalent to the synchronous power generator is provided, and furthermore, the photovoltaic system 1 of autonomously selecting the velocity adjustment rate according to the operation environment at the relevant time point from a plurality of velocity adjustment rates set in advance and setting the output according to the selected velocity adjustment rate is provided.

This will be more specifically described below.

Figure 9:
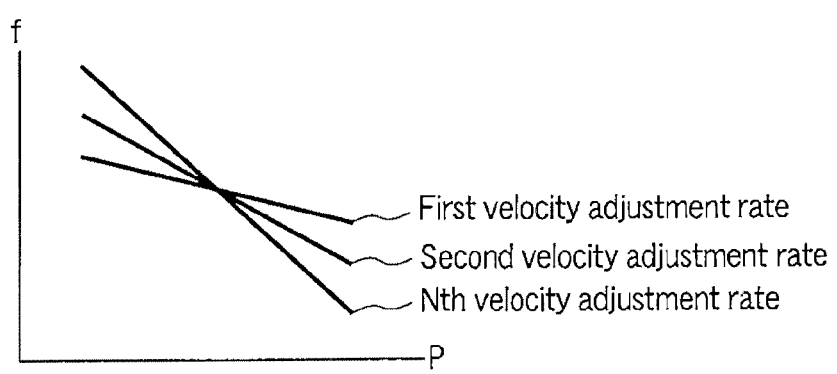
FIG. 9 is a view showing one example of a first velocity adjustment rate stored in a first memory, a second velocity adjustment rate stored in a second memory, and an $n^{th}$ velocity adjustment rate stored in an $n^{th}$ memory of a photovoltaic system according to a ninth example.

FIG. 9 is a view showing an example of a first velocity adjustment rate stored in the first memory 15a, a second velocity adjustment rate stored in the second memory 15b, and an $n^{th}$ velocity adjustment rate stored in the $n^{th}$ memory 15n. In FIG. 9, the horizontal axis is the active power P output from the photovoltaic system 1, and the vertical axis is the frequency f of the power system 90. The velocity adjustment rate here is shown with the function same as the velocity adjustment rate of a general synchronous power generator. In other words, the active power P output from the photovoltaic system 1 increases when the system load is increased and the frequency f of the power system 90 is lowered, and the active power P output from the photovoltaic system 1 reduces when the system load is reduced and the frequency f of the power system 90 is raised.

The effects of the characteristic selecting portion 18 and the selection condition setting section 19 are the same as the sixth example. The measurement section 11 measures the system data including the frequency f of the power system 90 to interconnect, as well as the output data including the active power P of the photovoltaic system 1. The measurement section 11 outputs the measured system data and the output data to the calculation section 10.

The calculation section 10 periodically implements the following process. In other words, the calculation section 10 compares the frequency f of the power system 90 at the time of implementation for this time and the frequency fo of the power system 90 at the time of implementation for the previous time, and calculates the difference f−fo as Δf. The calculation section 10 then calculates df/dP using the velocity adjustment rate selected by the characteristic selecting portion 18. The calculation section 10 calculates the value ΔP at which the output of the photovoltaic system 1 is to change by ΔP=Δf/(df/dP). The calculation section 10 then calculates as the output target value of the photovoltaic system 1 by P+ΔP using the active power P of the output data at the time of the implementation for the previous time. The calculation section 10 assumes the frequency of the output target value as f, and outputs the output target value and the frequency thereof to the photovoltaic section 2. The calculation section 10 performs such process for every few seconds, for example.

Others are the same as the effects of the photovoltaic system 1 of the sixth example. The power converter 6 converts to the AC power having the frequency f when converting the DC power to the AC power.

The ninth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such ninth example, the photovoltaic system 1 and the power supply system 1 having the power generator characteristics including the velocity adjustment rate of the same idea as the synchronous power generator are realized, thereby contributing to maintaining the system frequency. Moreover, since the velocity adjustment rate is freely set within the range of restriction of the capacity of the photovoltaic solar, cell 5 and the storage cell 8, the photovoltaic system and the power supply system 1 that contribute to maintaining the frequency according to the operation status in cooperation with other synchronous power generators are realized by setting a plurality of velocity adjustment rates.

Tenth Example

A configuration of a photovoltaic system 1 according to a tenth example is the same as the block diagram shown in FIG. 6A. A configuration of a power supply system 1 according to the tenth example is the same as the block diagram shown in FIG. 6B. However, each of first power generator characteristics stored in the first memory 15a, second power generator characteristics stored in the second memory 15b, ..., and $n^{th}$ power generator characteristics stored in the $n^{th}$ memory 15n includes an output change speed and output upper and lower limit values.

The LFC (Load Frequency Control) is carried out to maintain the system frequency constant. The system operator constantly ensures the total of the raising redundant force and the total of the lowering redundant force, that is, the LFC raising redundant force and lowering redundant force of the output of each power generator being operated assuming the fluctuation of the system load to respond to the system load fluctuation. The LFC raising redundant force and the lowering redundant force of each power generator are defined from the output change speed, the output upper and lower limit values, and the output at the relevant time point of the power generator. In the tenth example, that in which the behavior of the power generator is modeled focusing on the output change speed and the upper and lower limit values as one of the power generator characteristics is applied.

Describing a specific example, if a large amount of photovoltaic system 1 is introduced, it may become difficult to ensure the LFC redundant force by only the synchronous power generator of with smaller power generation ratio, and the suppression of photovoltaic generation may become necessary. This is because the photovoltaic system does not have the LFC redundant force.

In the tenth example, the photovoltaic system 1 of autonomously selecting the output change speed and the output upper and lower limit values according to the operation environment at the relevant time point from a plurality of power generator characteristics including the output change speed and the output upper and lower limit values set in advance to have the LFC redundant force defined by the selected output change speed and the output upper and lower limit values is provided.

This will be more specifically described below.

In the photovoltaic system 1 of the tenth example shown in FIG. 6A, a first output change speed stored in the first memory 15a, a second output change speed stored in the second memory 15b, and an $n^{th}$ output change speed stored in the $n^{th}$ memory 15n are output change speeds per unit time, and are expressed with MW/min. or KW/min. Furthermore, first output upper and lower limit values stored in the first memory 15a, second output upper and lower limit values stored in the second memory 15b, and $n^{th}$ output upper and lower limit values stored in the $n^{th}$ memory 15n are the upper limit value and the lower limit value of the active power that can be output from the photovoltaic system 1, and are the upper limit value and the lower limit value of the AC power obtained by converting the total of the DC power P1 that can be output from the photovoltaic solar cell 5 and the DC power P2 that can be discharged from the storage cell 8 by means of the power converter 6.

The effects of the characteristic selecting portion 18 and the selection condition setting section 19 are the same as the sixth example. The measurement section 11 measures the output data including the active power of the photovoltaic system 1, and outputs the measured output data to the calculation section 10.

The calculation section 10 periodically implements the following process. In other words, the calculation section 10 periodically calculates the output target value to be output to the photovoltaic section 2 based on the operation target value transmitted from the target value setting section 12, the active power of the output data transmitted from the measurement section 11, and the power generator characteristics, that is, the output change speed and the output upper and lower limit values selected by the characteristic selecting portion 18. The calculation method is such that the value added with the value that can increase the output until the next period and the output upper limit value obtained from the power generator characteristics are compared based on the current active power of the photovoltaic system 1 and the smaller one is set as the practical upper limit value, the value subtracted with the value that can reduce the output until the next period and the output lower limit value obtained from the power generator characteristics are compared based on the current active power of the photovoltaic system 1 and the larger one is set as the practical lower limit value, the operation target value is set as the output target value when the operation target value is between the practical upper limit value and the practical lower limit value, the practical upper limit value is set as the output target value when the operation target value is greater than the practical upper limit value, and the practical lower limit value is set as the output target value when the operation target value is smaller than the practical lower limit value, for output to the photovoltaic section 2.

Others are the same as the effects of the photovoltaic system 1 of the sixth example.

The tenth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such tenth example, the photovoltaic system and the power supply system 1 having the output change speed and the output upper and lower limit values, that is, the LFC redundant amount of the same idea as the synchronous power generator are realized, thereby contributing to maintaining the system frequency. Moreover, since the output change speed and the output upper and lower limit values are freely set within the range of restriction of the capacity of the photovoltaic solar cell 5 and the storage cell 8, the photovoltaic system and the power supply system 1 that greatly contribute to ensuring the LFC redundant force are realized by setting a plurality of output change speeds and the output upper and lower limit values.

Eleventh Example

FIG. 10A is a block diagram schematically showing the configuration of the photovoltaic system 1 according to an eleventh example.

The configuration of the photovoltaic system 1 according to the eleventh example differs from the configuration of the photovoltaic system 1 according to the sixth example shown in FIG. 6A in that the selection condition setting section 19 includes a clock 24 and a correspondence table storage portion 20a. Other configurations are the same as the configurations shown in FIG. 6A.

The power generator generally does not have the function of newly setting the power generator characteristics or autonomously changing the power generator characteristics, and thus does not have the function of changing to the power generator characteristics advantageous in operation depending on the time.

The eleventh example provides a photovoltaic system 1 that autonomously selects the power generator characteristics corresponding to the clock time from a plurality of power generator characteristics set in advance and behaves based on the selected power generator characteristics.

This will be more specifically described below.

The clock 24 ticks time. The selection condition setting section 19 is configured to read the current time from the clock 24. The correspondence table storage portion 20a stores a correspondence table showing the identifier of the power generator characteristics to be selected for every time. In the illustrated example, the memory identifier showing which power generator characteristics stored in which one of the plurality of memories to use for every time band is stored in the correspondence table storage portion 20a in the form of correspondence table, and the like.

For instance, a case in which the first power generator characteristics to be selected in the time band a is stored in the first memory 15a, the second power generator characteristics to be selected in the time band b is stored in the second memory 15b, and the $n^{th}$ power generator characteristics to be selected in the time band n is stored in the $n^{th}$ memory 15n, will be described below. In the correspondence table, the memory identifier corresponding to the first memory 15a storing the first power generator characteristics is corresponded with respect to the time band a, the memory identifier corresponding to the second memory 15b storing the second power generator characteristics is corresponded with respect to the time band b, and the memory identifier corresponding to the $n^{th}$ memory 15n storing the $n^{th}$ power generator characteristics is corresponded with respect to the time band n.

The selection condition setting section 19 reads out the memory identifier corresponded to the time from the correspondence table storage portion 20a based on the time read from the clock 24, and outputs the read memory identifier to the characteristic selecting portion 18 of the calculation section 10. Others are the same as the effects of the photovoltaic system 1 of the sixth example.

As shown in FIG. 10B, the eleventh example may provide a power supply system 1 comprising a power supply section 2B that does not include the photovoltaic solar cell. In this case, the above process is applied not only when the power is supplied from the storage cell B to the power system 90, but also when the power is supplied from the power system 90 to the storage cell 8.

According to the eleventh example, the photovoltaic system and the power supply system 1 in which the power generator characteristics are autonomously changed by time are realized. Therefore, the time band is divided to the time of rise in total demand in the morning, the time of sudden change in load from noon to past one o'clock in the afternoon, the time of peak in the afternoon, and the time of reduction in load in the afternoon, or to the time band during the day and the time band during the night, so that the photovoltaic system and the power supply system 1 that select the power generator characteristics corresponding to the system operation environment for each time band such as the hardness of system stability are realized.

In the eleventh example, the selection condition setting section 19 has been described as including the clock 24, but may include a calendar. In the configuration in which the selection condition setting section 19 includes the calendar instead of the clock 24, the photovoltaic system and the power supply system 1 that select the optimum power generator characteristics for every day, e.g. for weekdays and weekends, or for every days of the week, are realized. In the configuration in which the selection condition setting section 19 includes the calendar in addition to the clock 24, the photovoltaic system and the power supply system 1 that select the optimum power generator characteristics for every date and time are realized.

Twelfth Example

Figure 11A:
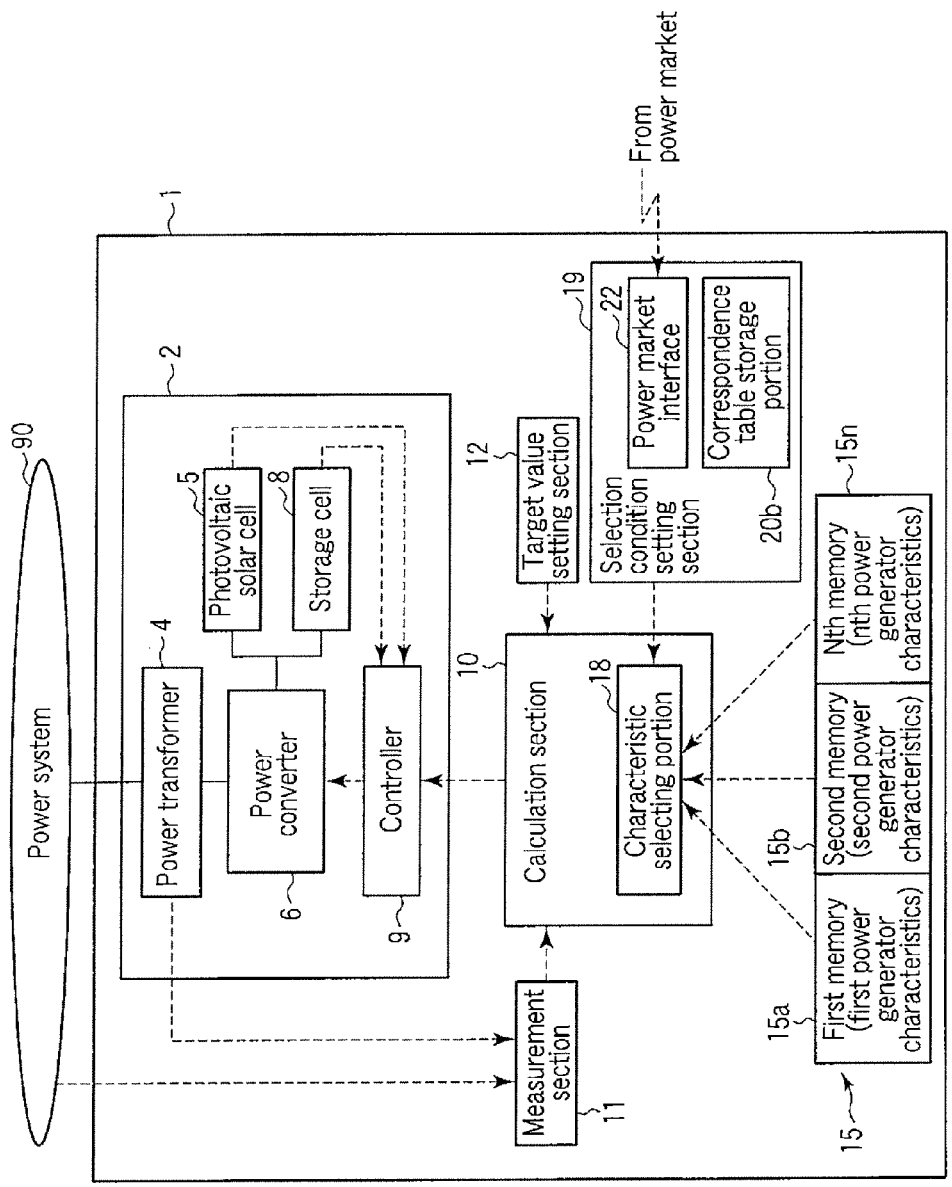
FIG. 11A is a block diagram schematically showing a configuration of a photovoltaic system according to a twelfth example.

FIG. 11A is a block diagram schematically showing the configuration of the photovoltaic system 1 according to a twelfth example.

The configuration of the photovoltaic system 1 according to the twelfth example differs from the configuration of the photovoltaic system 1 according to the sixth example shown in FIG. 6A in that the selection condition setting section 19 includes a power market interface 22 and a correspondence table storage portion 20b. Other configurations are the same as the configurations shown in FIG. 6A.

The power generator generally does not have the function of newly setting the power generator characteristics or autonomously changing the power generator characteristics, and thus does not have the function of changing to the power generator characteristics advantageous in operation depending on the market circumstances of the power market.

The twelfth example provides a photovoltaic system 1 that autonomously selects the power generator characteristics corresponding to the market circumstances of the power market from a plurality of power generator characteristics set in advance and behaves based on the selected power generator characteristics.

This will be more specifically described below.

The power market interface 22 receives the power market circumstances from the system managing the power market circumstances. The correspondence table storage portion 20b stores a correspondence table showing the identifier of the power generator characteristics to be selected for every power market circumstances. In the illustrated example, the memory identifier showing which power generator characteristics stored in which one of the plurality of memories to use for every power market circumstances is stored in the correspondence table storage portion 20b in the form of correspondence table, and the like.

The power market circumstances are the price of power such as yen/KhW currently in market transaction. In the correspondence table, the power generator characteristics at which the active power output from the photovoltaic system 1 becomes as large as possible is corresponded when the price of the power market is high, and the power generator characteristics at which the active power output from the photovoltaic system 1 becomes as small as possible is corresponded when the price of the power market is low.

The selection condition setting section 19 reads out the corresponding memory identifier from the correspondence table storage portion 20b based on the power market circumstances received through the power market interface 22, and outputs the read memory identifier to the characteristic selecting portion 18 of the calculation section 10. For instance, when the price of the power market is high, the power generator characteristics that increases the output increase speed of the photovoltaic system 1 is selected at the time of increase in power demand of the power system 90, and the power generator characteristics that slows the output reduction speed of the photovoltaic system 1 is selected at the time of reduction of the system load. Others are the same as the effects of the photovoltaic system 1 of the sixth example.

As shown in FIG. 11B, the twelfth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such twelfth example, the photovoltaic system and the power supply system 1 capable of autonomously changing the power generator characteristics depending on the power market circumstances are realized. Thus, the photovoltaic system and the power supply system 1 that can be economically operated according to the power market circumstances, that is, the price of the market transaction are realized.

Thirteenth Example

FIG. 12A is a block diagram schematically showing a configuration of a photovoltaic system 1 according to a thirteenth example.

The configuration of the photovoltaic system 1 according to the thirteenth example differs from the configuration of the photovoltaic system according to the sixth example shown in FIG. 6A in that the selection condition setting section 19 includes a weather information interface 23 and a correspondence table storage portion 20c. Other configurations are the same as the configurations shown in FIG. 6A.

The power generator generally does not have the function of newly setting the power generator characteristics or autonomously changing the power generator characteristics, and thus does not have the function of changing to the power generator characteristics advantageous in operation depending on the weather condition.

The thirteenth example provides a photovoltaic system 1 that autonomously selects the power generator characteristics corresponding to the weather condition from a plurality of power generator characteristics set in advance and behaves based on the selected power generator characteristics.

This will be more specifically described below.

The weather information interface 23 receives the current weather condition. The correspondence table storage portion 20c stores a correspondence table showing the identifier of the power generator characteristics to be selected for every weather condition. In the illustrated example, the memory identifier showing which power generator characteristics stored in which one of the plurality of memories to use for every weather condition is stored in the correspondence table storage portion 20c in the form of correspondence table, and the like.

The weather condition is the current weather condition such as sunny, cloud, rainy, change from sunny to cloudy, change from cloudy to sunny in the oo region. In the correspondence table, the power generator characteristics in which the synchronizing power is small is corresponded when the weather condition is stable, and the power generator characteristics in which the synchronizing power is large is corresponded when the weather condition changes.

The selection condition setting section 19 reads out the memory identifier corresponding to the weather condition from the correspondence table storage portion 20c based on the weather condition received through the weather information interface 23, and outputs the read memory identifier to the characteristic selecting portion 18 of the calculation section 10. Others are the same as the effects of the photovoltaic system 1 of the sixth example.

Figure 12B:
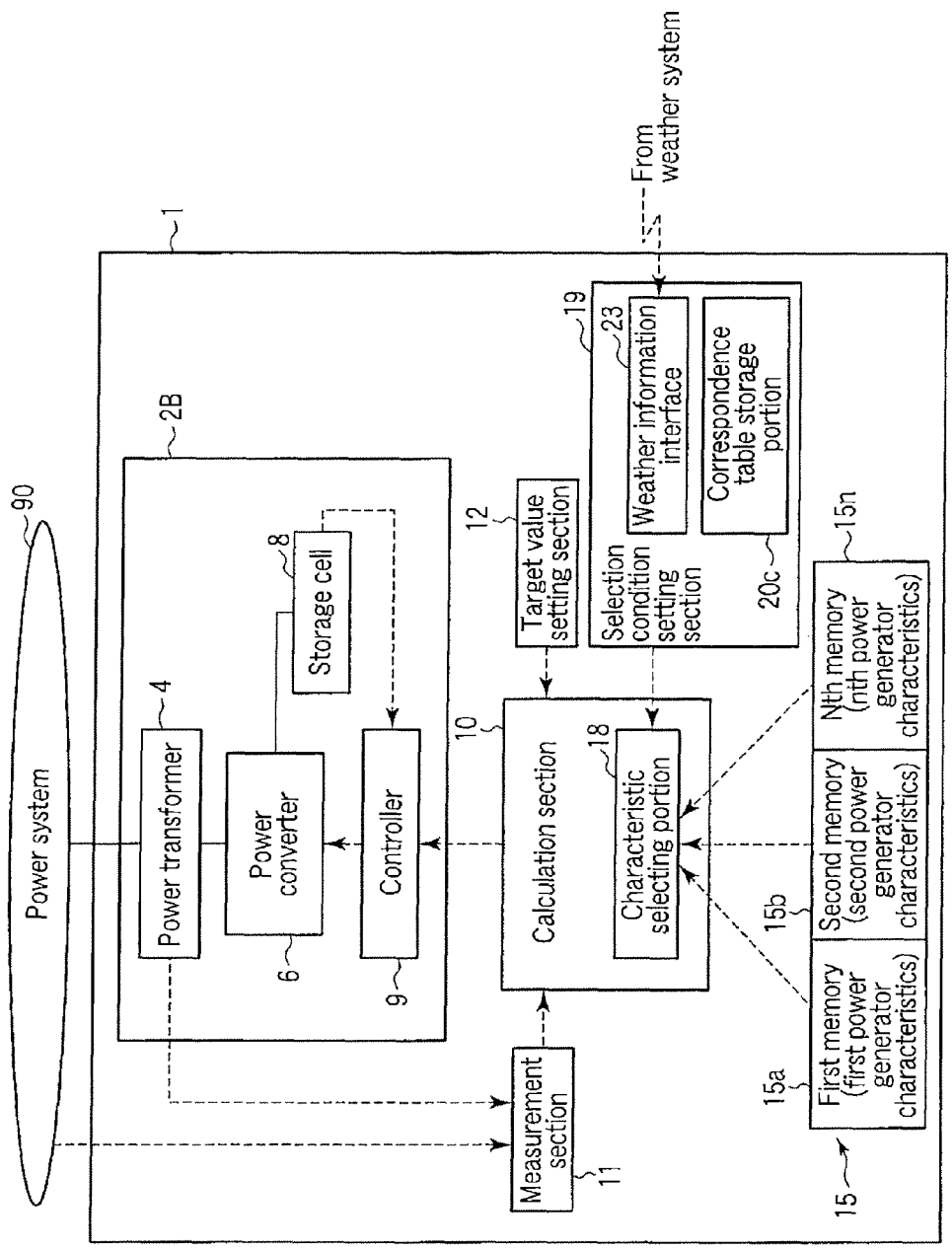
FIG. 12B is a block diagram schematically showing a configuration of a power supply system according to the thirteenth example.

As shown in FIG. 12B, the thirteenth example may provide a power supply system 1 comprising a power supply section 2B that does not include the photovoltaic solar cell. In such power supply system 1, the characteristics (for example, output and lifespan) of the storage cell 8 included in the power supply section 2B may change by the weather condition (for example, temperature, humidity), and it is thus advantageous to grasp the weather condition. Alternatively, it is advantageous to grasp the weather condition to predict the power consumption amount by an air conditioner and the like according to the weather condition in the power supply system 1. In this case, the above process is applied not only when the power is supplied from the storage cell 8 to the power system 90, but also when the power is supplied from the power system 90 to the storage cell 8.

According to such thirteenth example, the photovoltaic system and the power supply system 1 capable of autonomously changing the power generator characteristics depending on the weather condition are realized. Thus, the photovoltaic system and the power supply system 1 having the power generator characteristics corresponding to the weather condition such as the synchronizing power are realized.

Fourteenth Example

FIG. 13A is a block diagram schematically showing a configuration of the photovoltaic system 1 according to a fourteenth example.

The configuration of the photovoltaic system 1 according to the fourteenth example differs from the configuration of the photovoltaic system according to the sixth example shown in FIG. 6A in that the selection condition setting section 19 reads the remaining storage amount of the storage cell 8, which is a configuring element of the photovoltaic section 2. Other configurations are the same as the configurations shown in FIG. 6A.

The power generator generally does not have the function of newly setting the power generator characteristics or autonomously changing the power generator characteristics. The general power generator obviously does not have the function of changing to the power generator characteristics advantageous in operation according to the situation of the photovoltaic system 1, particularly, the remaining power amount of the storage cell 8.

The fourteenth example provides a photovoltaic system 1 that autonomously selects the power generator characteristics corresponding to the remaining power amount of the storage cell 8 incorporated in the photovoltaic system 1 from a plurality of power generator characteristics set in advance and behaves based on the selected power generator characteristics.

This will be more specifically described below.

The selection condition setting section 19 reads the remaining storage amount of the storage cell 8 configuring the photovoltaic section 2, and determines the memory identifier showing which power generator characteristics stored in which one of the plurality of memories to use according to the read remaining storage amount. Such selection condition setting section 19 outputs the memory identifier of the power generator characteristics to be selected corresponding to the remaining storage amount of the storage cell 8 to the characteristic selecting portion 18 of the calculation section 10.

When determining that the remaining storage amount of the storage cell 8 is small, the selection condition setting section 19 selects the power generator characteristics in which the discharge from the storage cell 8 is small and the charging to the storage cell 8 is large. When determining that the remaining storage amount of the storage cell 8 is large, the selection condition setting section 19 selects the power generator characteristics in which the discharge from the storage cell 8 is large and the charging to the storage cell 8 is small. The power generator characteristics in which the discharge from the storage cell 8 is small and the charging to the storage cell 8 is large includes the power generator characteristics of slowing the changing speed in the output increasing direction of the photovoltaic system 1 and increasing the changing speed in the output reducing direction of the photovoltaic system 1.

Others are the same as the effects of the photovoltaic system 1 of the sixth example.

Figure 13B:
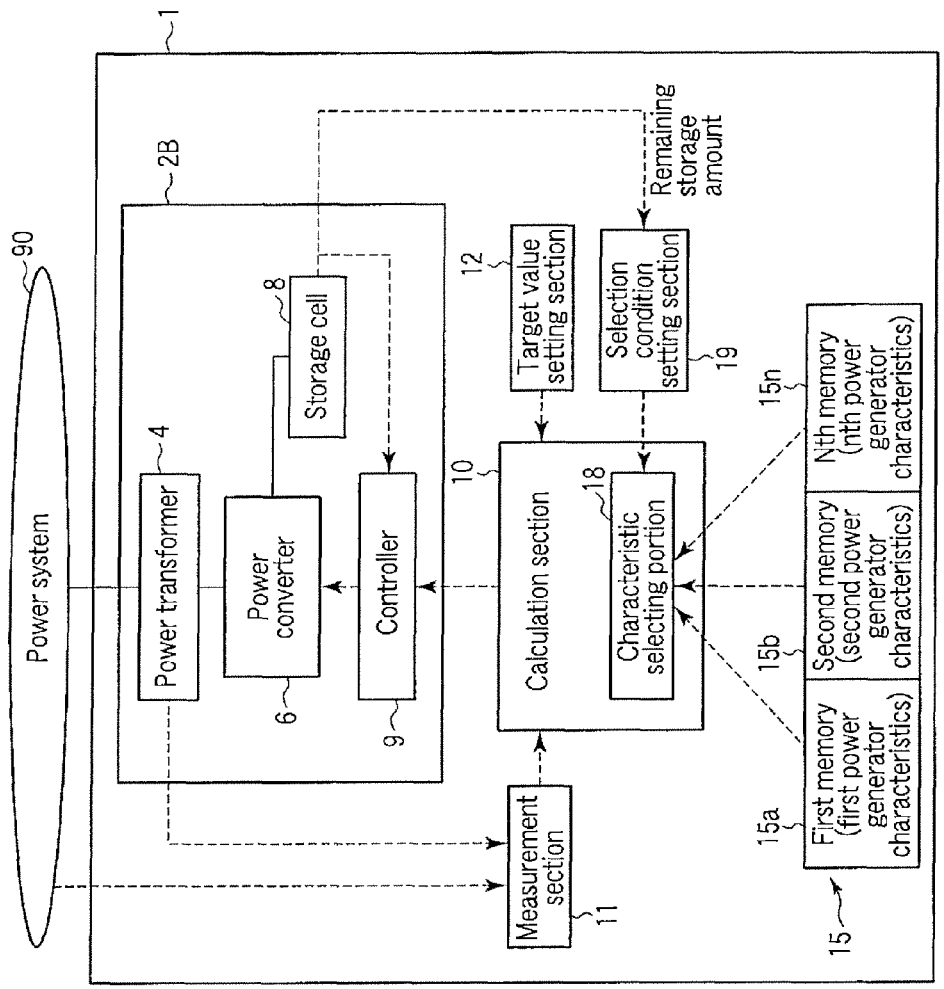
FIG. 13B is a block diagram schematically showing a configuration of a power supply system according to the fourteenth example.

As shown in FIG. 13B, the fourteenth example may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such fourteenth example, the operation rate at which the storage cell 8 functions is enhanced since the storage cell 8 of the photovoltaic system and the power supply system 1 is avoided from being charged too much or discharged too much. Thus, the photovoltaic system and the power supply system 1 having many opportunities of contributing to the stable system operation are realized.

Modification

Modifications will now be described. The modifications refer to the photovoltaic system 1 added with a central control interface for each of first to fourteenth examples, but the modification of the first example will be described herein with reference to the drawings.

FIG. 14A is a block diagram schematically showing a configuration of a photovoltaic system 1 according to a modification.

The configuration of the photovoltaic system 1 according to the modification differs from the configuration of the photovoltaic system 1 according to the first example shown in FIG. 1A in that a central control interface 25 is added. Other configurations are the same as the configurations shown in FIG. 1A.

The general photovoltaic system does not have the power generator characteristics of the synchronous power generator, and thus cannot contribute to the stable operation of the power system in cooperation with other power generators, as described above. Therefore, when the photovoltaic system is coupled to the power system, the photovoltaic system cannot be controlled online from the central control system to contribute to the stable operation of the power system similar to the other synchronous power generators.

In the modification, the photovoltaic system, having the power generator characteristics equivalent to the synchronous power generator and also being able to set and change such power generator characteristics, that autonomously selects the power generator characteristics suited to the operation environment at the time from a plurality of power generator characteristics set in advance and behaves based on the selected power generator characteristics is realized. Furthermore, the photovoltaic system 1 capable of being controlled similar to the other synchronous power generators from the central control system to contribute to the stable system operation is provided.

This will be more specifically described below.

The central control interface 25 is coupled to the LFC system that maintains the system frequency constant, and the control system of the power generator such as the voltage reactive power control system that maintains the voltage of the monitoring point of the power system 90 within a tolerable range through a communication line. Such central control interface 25 receives a command value from the central control system to the photovoltaic system 1, and outputs the received command value to the target value setting section 12 as an operation target value. The central control interface 25 reads the output data to the power system 90 of the photovoltaic system 1 such as the data of the active power and the reactive power from the photovoltaic section 2, and transmits the same to the central control system.

In the central control system, the control amount of each power generator that stably operates the power system 90 is calculated using the output data transmitted from each power generator, and the calculated control amount is transmitted to the central control interface 25 of each power generator as an operation target value. Others are the same as the effects of the photovoltaic system 1 of the first example.

As shown in FIG. 14B, the modification may provide a power supply system 1 comprising a power supply section 2B that does not include the photovoltaic solar cell. In this case, the above process is applied not only when the power is supplied from the storage cell 8 to the power system 90, but also when the power is supplied from the power system 90 to the storage cell 8.

According to such modification, the photovoltaic system and the power supply system 1 that are controlled from the central control system in addition to the effects described in the first example are realized. In other words, the power generator characteristics equivalent to the synchronous power generator may be provided to the photovoltaic system and the power supply system 1 to contribute to the stable operation of the power system 90 by serving as the target power generator of the LFC system that maintains frequency, or by serving as the target power generator of the voltage reactive power control system.

It should be recognized that the effects of the modification are obtained for each modification of the second to fourteenth examples, whose description is omitted, in addition to the effects of each example.

According to the embodiments, a photovoltaic system and a power supply system having power generator characteristics equivalent to the synchronous power generator are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photovoltaic system capable of supplying power to a power system, the photovoltaic system comprising:
   a memory configured to store power generator characteristics to be applied to the photovoltaic system and a plan of the power generator characteristics corresponded to time;
   a plan setting section configured to accept a direct input or a remote input through a communication line of the plan of the power generator characteristics is further provided;
   a measurement section configured to measure system data of the power system to which the photovoltaic system couples, and output data from the photovoltaic system to the power system;
   a target value setting section configured to accept a setting of an operation target value of the photovoltaic system;
   a calculation section configured to calculate an output target value to be output by the photovoltaic system using the power generator characteristics read from the memory, the operation target value transmitted from the target value setting section, and the system data and the output data transmitted from the measurement section; and
   a photovoltaic section including a photovoltaic solar cell, a storage cell, and a power converter configured to convert an electric energy output from the photovoltaic solar cell and the storage cell to a power adapted to the power system, the photovoltaic section being configured to supply a corresponding power to the power system based on the output target value calculated by the calculation section,
   wherein the calculation section includes a clock and a characteristic selecting portion configured to select the power generator characteristics corresponded to current time of the clock along the plan of the power generator characteristics stored in the memory, and is configured to calculate the output target value using the selected power generator characteristics, the operation target value, the system data, and the output data.

2. The photovoltaic system according to claim 1, further comprising a characteristic setting section configured to accept a direct input or a remote input through a communication line of the power generator characteristics stored in the memory.

3. The photovoltaic system according to claim 1, wherein the memory is configured to store a plurality of power generator characteristics each of which is corresponded to a unique identifier,
   a selection condition setting section configured to set an identifier for selecting the power generator characteristics to be selected from the memory is further provided, and
   the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data.

4. The photovoltaic system according to claim 1, wherein the power generator characteristics is one of including a power generator model, a speed governor system model, an excitation system model, and a characteristic constant of a configuring element of each model, including a power phase curve, including a velocity adjustment rate, or including an output change speed and output upper and lower limit values.

5. The photovoltaic system according to claim 1, further comprising a central control interface configured to output an operation target value received from a central control system to the target value setting section, and configured to transmit the output data from the photovoltaic system to the power system to the central control system.

6. A photovoltaic system capable of supplying power to a power system, the photovoltaic system comprising:
- a memory configured to store power generator characteristics to be applied to the photovoltaic system and a plurality of power generator characteristics each of which is corresponded to a unique identifier;
- a selection condition setting section configured to set identifier for selecting the power generator characteristics to be selected from the memory is further provided;
- a measurement section configured to measure system data of the power system to which the photovoltaic system couples, and output data from the photovoltaic system to the power system;
- a target value setting section configured to accept a setting of an operation target value of the photovoltaic system;
- a calculation section configured to calculate an output target value to be photovoltaic system using the power generator characteristics read from the memory, the operation target value transmitted from the target value setting section, and the system data and the output data transmitted from the measurement section; and
- a photovoltaic section including a photovoltaic solar cell, a storage cell and a power converter configured to convert an electric every output from the photovoltaic solar cell and the storage cell to a power adapted to the power system, the photovoltaic section being configured to supply a corresponding power to the power system based on the output target value calculated by the calculation section,
- wherein the calculation section includes a characteristic selecting portion configured to select the power generator characteristics corresponded to the identifier set by the selection condition setting section of the plurality of power generator characteristics stored in the memory, and is configured to calculate the output tar ret value using the selected power generator characteristics, the operation target value, the system data, and the output data, and
- the selection condition setting section includes a clock and a correspondence table storage portion configured to store with a correspondence table indicating the identifier of the power generator characteristics to be selected for every time, and is configured to read out the identifier corresponding to the time read from the clock from the correspondence table storage portion and to output the read identifier to the characteristic selecting portion of the calculation section.

7. A photovoltaic system capable of supplying power to a power system, the photovoltaic system comprising:
- a memory configured to store power generator characteristics to be applied to the photovoltaic system and a plurality of power generator characteristics each of which is corresponded to a unique identifier;
- a selection condition setting section configured to set an identifier for selecting the power generator characteristics to be selected from the memory is further provided;
- a measurement section configured to measure system data of the power system to which the photovoltaic system couples, and output data from the photovoltaic system to the power system;
- a target value setting section configured to accept a setting of an operation target value of the photovoltaic system;
- a calculation section configured to calculate an output target value to be output by the photovoltaic system using the power generator characteristics read from the memory, the operation target value transmitted from the target value setting section, and the system data and the output data transmitted from the measurement section; and
- a photovoltaic section including a photovoltaic solar cell, a storage cell, and a power converter configured to convert an electric energy output from the photovoltaic solar cell and the storage cell to a power adapted to the power system, the photovoltaic section being configured to supply a corresponding power to the power system based on the output target value calculated by the calculation section,
- wherein the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data, and
- the selection condition setting section includes a power market interface configured to receive power market circumstances and a correspondence table storage portion configured to store with a correspondence table indicating the identifier of the power generator characteristics to be selected for every power market circumstances, and is configured to read out the identifier corresponding to the power market circumstances received through the power market interface from the correspondence table storage portion and to output the read identifier to the characteristic selecting portion of the calculation section.

8. A photovoltaic system capable of supplying power to a power system, the photovoltaic system comprising:
- a memory configured to store power generator characteristics to be applied to the photovoltaic stem and a quality of power generator characteristics each of which is corresponded to a unique identifier;
- a selection condition setting section configured to set an identifier for selecting the power generator characteristics to be selected from the memory is further provided;
- a measurement section configured to measure system data of the power system to which the photovoltaic system couples, and output data from the photovoltaic system to the power system;
- a target value setting section configured to accept a setting of an operation target value of the photovoltaic system;
- a calculation section configured to calculate an output target value to be output by the photovoltaic system using the power generator characteristics read from the memory, the operation target value transmitted from the target value setting section, and the system data and the output data transmitted from the measurement section; and a photovoltaic section including a photovoltaic solar cell, a storage cell, and a power converter configured to convert an electric energy output from the photovoltaic solar cell and the storage cell to a power adapted to the power system, the photovoltaic section being configured to supply a corresponding power to the power system based on the output target value calculated by the calculation section, wherein the calculation section includes a characteristic select portion configured to select the power generator characteristics corresponded to the identifier set by the selection condition setting section of the plurality of power generator characteristics stored in the memory, and is configured to calculate the output target vale using the selected power generator characteristics, the operation target value, the system data, and the output data, and the selection condition setting section includes a weather information interface configured to receive a weather condition and a correspondence table storage portion configured to store with a correspondence table indicating the identifier of the power generator characteristics to be selected for every weather condition, and is configured to read out the identifier corresponding to the weather condition received through the weather information interface from the correspondence table storage portion and to output the read identifier to the characteristic selecting portion of the calculation section.

9. A photovoltaic system capable of supplying power to a power system, the photovoltaic system comprising:
a memory configured to store power generator characteristics to be applied to the photovoltaic system and a plurality of power generator characteristics each of which is corresponded to a unique identifier;
a selection condition setting section configured to set an identifier for selecting the power generator characteristics to be selected from the memory is further provided;
a measurement section configured to measure system data of the power system to which the photovoltaic system couples, and output data from the photovoltaic system to the power system;
a target value setting section configured to accept a setting of an operation target value of the photovoltaic system;
a calculation section configured to calculate an output target value to be output by the photovoltaic system using the power generator characteristics read from the memory, the operation target value transmitted from the target value setting section, and the system data and the output data transmitted from the measurement section; and
a photovoltaic section including a photovoltaic solar cell, a storage cell, and a power converter configured to convert an electric energy output from the photovoltaic solar cell and the storage cell to a power adapted to the power system, the photovoltaic section being configured to supply a corresponding power to the power system based on the output target value calculated by the calculation section, wherein the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data, and the selection condition setting section is configured to output the identifier of the power generator characteristics to be selected to the characteristic selecting portion of the calculation section according to a remaining storage amount of the storage cell configuring the photovoltaic section.

10. A power supply system capable of supplying power to a power system, the power supply system comprising:
a memory configured to store power generator characteristics to be applied to the power supply system and an of the lower generator characteristics corresponded to time;
a plan setting section configured to accept a direct input or a remote input through a communication line of the plan of the power generator characteristics is further provided;
a measurement section configured to measure system data of the power system to which the power supply system couples, and output data from the power supply system to the power system;
a target value setting section configured to accept a setting of an operation target value of the power supply system;
a calculation section configured to calculate an output target value to be output by the power supply system using the power generator characteristics read from the memory, the operation target value transmitted from the target value setting section, and the system data and the output data transmitted from the measurement section; and
a power supply section including a storage cell and a power converter configured to convert an electric energy output from the storage cell to a power adapted to the power system, the power supply section being configured to supply a corresponding power to the power system based on the output target value calculated by the calculation section, wherein the calculation section includes a clock and a characteristic selecting portion configured to select the power generator characteristics corresponded to current time of the clock along the plan of the power generator characteristics stored in the memory, and is configured to calculate the output target value using the selected power generator characteristics, the operation target value, the system data, and the output data.

11. The power supply system according to claim 10, further comprising a characteristic setting section configured to accept a direct input or a remote input through a communication line of the power generator characteristics stored in the memory.

12. The power supply system according to claim 10, wherein
the memory is configured to store a plurality of power generator characteristics each of which is corresponded to a unique identifier,
a selection condition setting section configured to set an identifier for selecting the power generator characteristics to be selected from the memory is further provided, and
the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data.

13. The power supply system according to claim 10, wherein the power generator characteristics is one of including a power generator model, a speed governor system model, an excitation system model, and a characteristic constant of a configuring element of each model, including a power phase curve, including a velocity adjustment rate, or including an output change speed and output upper and lower limit values.

14. The power supply system according to claim 10, further comprising a central control interface configured to output an operation target value received from a central control system to the target value setting section, and configured to transmit the output data from the power supply system to the power system to the central control system.

15. A power supply system capable of supplying power to a power system, the power supply system comprising:
a memory configured to store power generator characteristics to be applied to the power supply system;
a measurement section configured to measure system data of the power system to which the power supply system couples, and output data from the power supply system to the power system;
a target value setting section configured to accept a setting of an operation target value of t power supply system;
a calculation section configured to calculate an output target value to be output by the power supply system using the power generator characteristics read from the memory, the operation target value transmitted from the target value setting section, and the system data and the output data transmitted from the measurement section; and
a power supply section including a storage cell and a power converter configured to convert an electric energy output from the storage cell to a power adapted to the power system, the power supply section being configured to supply a corresponding power to the power system based on the output target value calculated by the calculation section,
wherein the memory is configured to store a plurality of power generator characteristics each of which is corresponded to a unique identifier,
a selection condition setting section configured to set an identifier for selecting power generator characteristics to be selected from the memory is further provided,
the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data,
the selection condition setting section includes a clock and a correspondence table storage portion configured to store with a correspondence table indicating the identifier of the power generator characteristics to be selected for every time, and is configured to read out the identifier corresponding to the time read from the clock from the correspondence table storage portion and to output the read identifier to the characteristic selecting portion of the calculation section.

16. A power supply system capable of supplying power to a power system, the power supply system comprising:
a memory configured to store power generator characteristics to be applied to the power supply system;
a measurement section configured to measure system data of the power system to which the power supply system couples, and output data from the power supply system to the power system;
a target value satin section configured to accept a setting of an operation target value of the power supply system;
a calculation section configured to calculate an output target value to be output by the power supply system using the power generator characteristics read from the memory, the operation target value transmitted from the target value setting section, and the system data and the output data transmitted from the measurement section; and
a power supply section including a storage cell and a power converter configured to convert an electric energy output from the storage cell to a power adapted to the power system, the power supply section being configured to supply a corresponding power to the power system based on the output target value calculated by the calculation section,
wherein the memory is configured to store a plurality of power generator characteristics each of which is corresponded to a unique identifier,
a selection condition setting section configured to set an identifier for selecting the power generator characteristics to be selected from the memory is further provided,
the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data,
the selection condition setting section includes a power market interface configured to receive power market circumstances and a correspondence table storage portion configured to store with a correspondence table indicating the identifier of the power generator characteristics to be selected for every power market circumstances, and is configured to read out the identifier corresponding to the power market circumstances received through the power market interface from the correspondence table storage portion and to output the read identifier to the characteristic selecting portion of the calculation section.

17. A power supply system capable of supplying power to a power system, the power supply system comprising:
a memory configured to store power generator characteristics to be applied to the power supply system;
a measurement section configured to measure system data of the power system to which the power supply system couples, and output data from the power supply system to the power system;
a target value setting section configured to accept a setting of an operation target value of the power supply system;
a calculation section configured to calculate an output target value to be output by the power supply system using the power generator characteristics read from the memory, the operation target value transmitted from the target value setting section, and the system data and the output data transmitted from the measurement section; and
a power supply section including a storage cell and a power converter configured to convert an electric energy output from the storage cell to a power adapted to the power system, the power supply section being configured to supply a corresponding power to the power system based on the output target value calculated by the calculation section, wherein the memory is configured to store a plurality of power generator characteristics each of which is corresponded to a unique identifier, a selection condition setting section configured to set an identifier for selecting the power generator characteristics to be selected from the memory is further provided, the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data, the selection condition setting section includes a weather information interface configured to receive a weather condition and a correspondence table storage portion configured to store with a correspondence table indicating the identifier of the power generator characteristics to be selected for every weather condition, and is configured to read out the identifier corresponding to the weather condition received through the weather information interface from the correspondence table storage portion and to output the read identifier to the characteristic selecting portion of the calculation section.

18. A power supply system capable of supplying power to a power system, the power supply system comprising:

a memory configured to store power generator characteristics to be applied to the power supply system;

a measurement section configured to measure system data of the power system to which the power supply system couples, and output data from the power supply system to the power system;

a target value setting section configured to accept a setting of an operation target value of the power supply system;

a calculation section configured to calculate an output target value to be output b the power supply system using the power generator characteristics read from the memory, the operation target value transmitted from the target value setting section, and the system data and the output data transmitted from the measurement section; and a power supply section including a storage cell and a power converter configured to convert an electric energy output from the storage cell to a power adapted to the power system, the power supply section being configured to supply a corresponding power to the power system based on the output target value calculated by the calculation section, wherein the memory is configured to store a plurality of power generator characteristics each of which is corresponded to a unique identifier, a selection condition setting section configured to set an identifier for selecting the power generator characteristics to be selected from the memory is further provided, the calculation section includes a characteristic selecting portion configured to select the power generator characteristics corresponded to the identifier set by the selection condition setting section of the plurality of power generator characteristics stored in the memory, and is configured to calculate the output target value using the selected power generator characteristics, the operation target value, the system data, and the output data, the selection condition setting section is configured to output the identifier of the power generator characteristics to be selected to the characteristic selecting portion of the calculation section according to a remaining storage amount of the storage cell configuring the power supply section.

* * * * *